US012745668B2

(12) United States Patent
He et al.

(10) Patent No.: US 12,745,668 B2
(45) Date of Patent: Sep. 22, 2026

(54) DAM SURROUNDING A DIE ON A SUBSTRATE

(71) Applicant: Intel Corporation, Santa Clara, CA (US)

(72) Inventors: Liang He, Chandler, AZ (US); Jisu Jiang, Mountain View, CA (US); Jung Kyu Han, Chandler, AZ (US); Gang Duan, Chandler, AZ (US); Yosuke Kanaoka, Chandler, AZ (US); Jason M. Gamba, Gilbert, AZ (US); Bai Nie, Chandler, AZ (US); Robert Alan May, Chandler, AZ (US); Kimberly A. Devine, Gilbert, AZ (US); Mitchell Armstrong, Eden Prairie, NM (US); Yue Deng, Chandler, AZ (US)

(73) Assignee: Intel Corporation, Santa Clara, CA (US)

( * ) Notice: Subject to any disclaimer, the term of this patent is extended or adjusted under 35 U.S.C. 154(b) by 458 days.

(21) Appl. No.: 17/481,245

(22) Filed: Sep. 21, 2021

(65) Prior Publication Data

US 2023/0086920 A1 Mar. 23, 2023

(51) Int. Cl.
*H10W 74/10* (2026.01)
*H10W 76/45* (2026.01)

(52) U.S. Cl.
CPC ....... *H10W 74/134* (2026.01); *H10W 74/124* (2026.01); *H10W 74/129* (2026.01); *H10W 76/45* (2026.01)

(58) Field of Classification Search
None
See application file for complete search history.

(56) References Cited

U.S. PATENT DOCUMENTS 8,071,893 B2 * 12/2011 Lin ..................... H05K 1/0218 174/521
9,165,876 B2 * 10/2015 Lee ..................... H10W 90/00
9,985,191 B2 * 5/2018 Chiu ..................... H10H 20/857
10,361,160 B2 * 7/2019 Hsu ..................... H10W 70/614
10,629,455 B1 * 4/2020 Chen ..................... H10W 74/012
2003/0085475 A1 * 5/2003 Im ..................... H10W 40/70 257/796
2010/0078791 A1 * 4/2010 Yim ..................... H10W 90/00 257/E23.129
2013/0270688 A1 * 10/2013 Ota ..................... H10W 40/10 257/690
2014/0091461 A1 * 4/2014 Shen ..................... H10W 76/47 257/737
2016/0240465 A1 * 8/2016 Chen ..................... H10W 70/65

(Continued)

*Primary Examiner* — Nishath Yasmeen

(74) *Attorney, Agent, or Firm* — Schwabe, Williamson & Wyatt, P.C.

(57) ABSTRACT

Embodiments described herein may be related to apparatuses, processes, and techniques for a dam structure on a substrate that is proximate to a die coupled with the substrate, where the dam decreases the risk of die shift during encapsulation material flow over the die during the manufacturing process. The dam structure may fully encircle the die. During encapsulation material flow, the dam structure creates a cavity that moderates the different flow rates of material that otherwise would exert different pressures the sides of the die and cause to die to shift its position on the substrate. Other embodiments may be described and/or claimed.

19 Claims, 21 Drawing Sheets

(56) References Cited

U.S. PATENT DOCUMENTS

| | | | | |
|---|---|---|---|---|
| 2017/0110416 | A1* | 4/2017 | Miao | H10W 42/00 |
| 2018/0342466 | A1* | 11/2018 | Lin | H10W 42/121 |
| 2020/0006235 | A1* | 1/2020 | Aleksov | H10W 70/093 |
| 2020/0365525 | A1* | 11/2020 | Wu | H10W 42/121 |
| 2021/0057354 | A1* | 2/2021 | Eid | H10W 40/70 |
| 2021/0066228 | A1* | 3/2021 | Lu | H10W 42/121 |
| 2021/0343611 | A1* | 11/2021 | Chen | H10W 74/016 |
| 2022/0157777 | A1* | 5/2022 | Yang | H10W 42/121 |

* cited by examiner

DAM SURROUNDING A DIE ON A SUBSTRATE

FIELD

Embodiments of the present disclosure generally relate to the field of semiconductor packaging, and in particular to encapsulated dies on a substrate.

BACKGROUND

Continued growth in computing and mobile devices will continue to increase the demand for increased reliability of dies within semiconductor packages.

DETAILED DESCRIPTION

Figure 1:
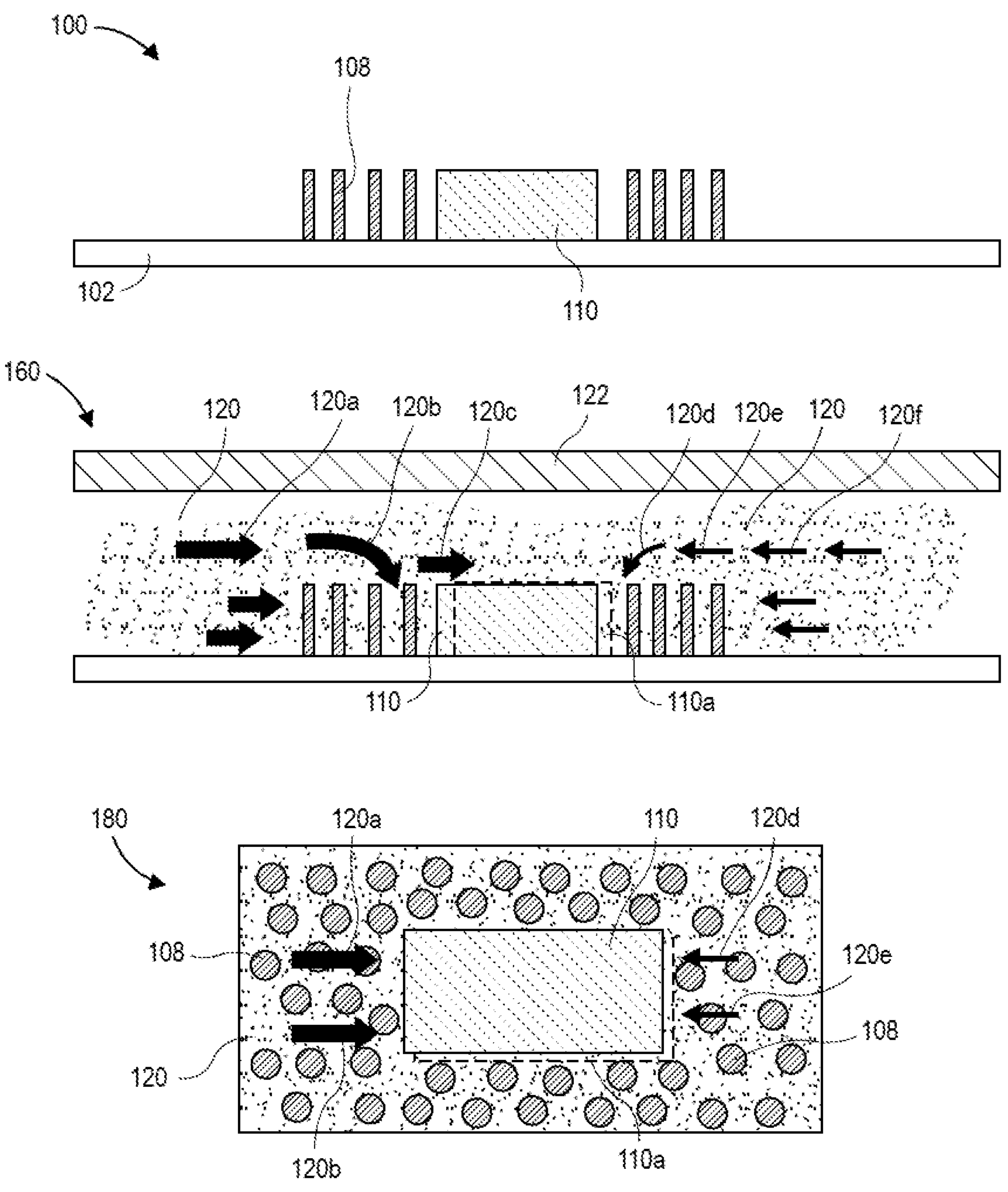
FIG. 1 illustrates block diagrams of various stages of a legacy process of flowing a material onto a substrate that may cause a die coupled with the substrate to shift.

Embodiments described herein may be related to apparatuses, processes, and techniques for creating a dam structure on a substrate that is proximate to a die coupled with the substrate. During the manufacturing process, the dam structure decreases the risk of die shifting during material flow over the die. In embodiments, the dam structure may fully encircle the die. In embodiments, the dam structure and the die may be within a cavity.

In embodiments, the dam structure moderates different flow rates of material, for example epoxy or molding flow, during manufacturing processes that may include an encapsulation or thermal compression bonding (TCB) applied to the substrate and the die. In embodiments, the dam structure may create a cavity structure that surrounds the die, where the different flow rates are moderated as they flow over the top of the dam and down toward the substrate before reaching the die. In embodiments, the dam structure will provide symmetry of material flow by confining the material within the cavity structure and cause pressure on side walls of the die to be symmetric when the die is at or near the middle of the cavity. In embodiments, the die may be an active die, a passive die, a bridge, for example an embedded multi-die interconnect bridge (EMIB), or may be some other component coupled with the substrate.

In embodiments, a partial dam structure may be used as an anchoring mechanism to apply supporting material between the partial dam structure and the die. This supporting material may include a dielectric, a CUF, or some other electrically insulative material. In other embodiments, if the die includes bumps, such as copper bumps, used to couple the die with the substrate, full dam and/or partial dam structures may be used to implement CUF pinning and dispensing underneath the die and around the bumps.

In legacy implementations, without the dam structure, the different flow rates of the material and/or asymmetry of material flow may exert different pressures on different sides of the die, causing the die to shift. Such a die shift could lead to misalignment for downstream copper plating, and may ultimately result in die and/or substrate failure. In the case of TCB, the additional pressure to increase the flow of material, depending upon the geometry of the substrate and other cavities or features that are a part of the substrate, may cause rate of flow of material to differ greatly in different directions across the substrate.

In embodiments, the dam structure may be a plated copper wall that surrounds the die. In embodiments the wall may be a rectangular shape, a circular shape, or some other shape that may depend upon the geometry of the die, and/or the expected flow rates and directions of flow material during manufacturing. A height of the wall of the dam may be determined based upon the height of the die, the height of a surrounding cavity, and/or the geometry of the substrate. In embodiments, the dam may be a low aspect ratio dam that may be used to facilitate the alignment and placement of a die within the perimeter of the dam. In embodiments, a dam may be placed without requiring an increase to legacy design rules used to minimize additional area logic die size requirements.

Legacy implementations to address die shifting may include predictive compensation of material flow. However, predictive compensation may only address repeated die shifting, and cannot account for or compensate for random die shifts during the manufacturing process. Other legacy implementations may use die bonding film (DBF) optimization, however DBF optimization may not be fine enough to address sub-micron die shift targets.

In a legacy wafer level molding process during manufacturing, the melted mold material will flow toward the peripheral of the mold chase. As a result, when the mold reaches the die, different flow rates of the mold material may result in an asymmetric pressure on die side walls. The resultant moment may cause both die shift and/or die rotation. This effect may not be an issue for wafer level molding if the magnitude of die shift is in the tens of micrometers. However, for example, for dies with a tight bump pitch scaling, for example EMIBs, a minor contribution to die shift can have high impact.

In embodiments, the dam structure may serve a function to create a cavity into which a die is placed on a substrate. Note that in embodiments the die may be in an actual cavity on the substrate and a dam structure may not be specifically required. Melted mold material flow within cavity will be confined and result in minimal asymmetric pressure on die side walls, and will not follow the overall various mold flow directions toward the mold chase peripheral within the cavity. In embodiments, a die may be placed in the middle of the cavity to minimize effect on die shift or rotation.

In the following detailed description, reference is made to the accompanying drawings which form a part hereof, wherein like numerals designate like parts throughout, and in which is shown by way of illustration embodiments in which the subject matter of the present disclosure may be practiced. It is to be understood that other embodiments may be utilized and structural or logical changes may be made without departing from the scope of the present disclosure. Therefore, the following detailed description is not to be taken in a limiting sense, and the scope of embodiments is defined by the appended claims and their equivalents.

For the purposes of the present disclosure, the phrase "A and/or B" means (A), (B), or (A and B). For the purposes of the present disclosure, the phrase "A, B, and/or C" means (A), (B), (C), (A and B), (A and C), (B and C), or (A, B and C).

The description may use perspective-based descriptions such as top/bottom, in/out, over/under, and the like. Such descriptions are merely used to facilitate the discussion and are not intended to restrict the application of embodiments described herein to any particular orientation.

The description may use the phrases "in an embodiment," or "in embodiments," which may each refer to one or more of the same or different embodiments. Furthermore, the terms "comprising," "including," "having," and the like, as used with respect to embodiments of the present disclosure, are synonymous.

The term "coupled with," along with its derivatives, may be used herein. "Coupled" may mean one or more of the following. "Coupled" may mean that two or more elements are in direct physical or electrical contact. However, "coupled" may also mean that two or more elements indirectly contact each other, but yet still cooperate or interact with each other, and may mean that one or more other elements are coupled or connected between the elements that are said to be coupled with each other. The term "directly coupled" may mean that two or more elements are in direct contact.

Various operations may be described as multiple discrete operations in turn, in a manner that is most helpful in understanding the claimed subject matter. However, the order of description should not be construed as to imply that these operations are necessarily order dependent.

As used herein, the term "module" may refer to, be part of, or include an ASIC, an electronic circuit, a processor (shared, dedicated, or group) and/or memory (shared, dedicated, or group) that execute one or more software or firmware programs, a combinational logic circuit, and/or other suitable components that provide the described functionality.

Various Figures herein may depict one or more layers of one or more package assemblies. The layers depicted herein are depicted as examples of relative positions of the layers of the different package assemblies. The layers are depicted for the purposes of explanation, and are not drawn to scale. Therefore, comparative sizes of layers should not be assumed from the Figures, and sizes, thicknesses, or dimensions may be assumed for some embodiments only where specifically indicated or discussed.

FIG. 1 illustrates block diagrams of various stages of a legacy process of flowing a material onto a substrate that may cause a die coupled with the substrate to shift. Package 100 is a cross-section side view of a package during a stage of manufacturing. Package 100 includes a substrate 102 and a plurality of copper pillars 108 that are physically and/or electrically coupled with the substrate 102. A die 110 may also be within the plurality of copper pillars 108, and physically and/or electrically coupled with the substrate 102. In embodiments, the die 110 may have one or more conductive bumps (not shown), that may include copper, to electrically couple the die 110 with the substrate 102.

Package 160, which may be similar to package 100, shows a cross-section side view of a stage in the manufacturing process where an epoxy or composite material 120 that is being flowed, with the flow being aided by a pressure plate 122 forcing the epoxy 120 toward the substrate 102. In this process, flow rates 120*a*-120*f* are shown and have different magnitudes and directions across the substrate 102. For example, flow rates 120*a*-120*c* show a heavier flow that push on the left side of the die 110, while flow rates 120*d*-120*f* show lighter flows that are pushing on the right side of the die 110. As a result, these different pressures acting on the die 110 may cause the die 110 to shift to a new position 110*a*. If this happens, unpredictable results may occur during subsequent manufacturing stages resulting in misalignment or electrical couplings between the die 110*a* and other components coupled with the substrate 102.

Package 180, which may be similar to package 160, shows a top-down view of the copper pillars 108 with epoxy 120 flowing toward the die 110, with flow rates 120*a*, 120*b* that are substantially greater than flow rates 120*d*, 120*e*. As a result, the die 110 will tend to shift to die position 110*a*.

Figure 2:
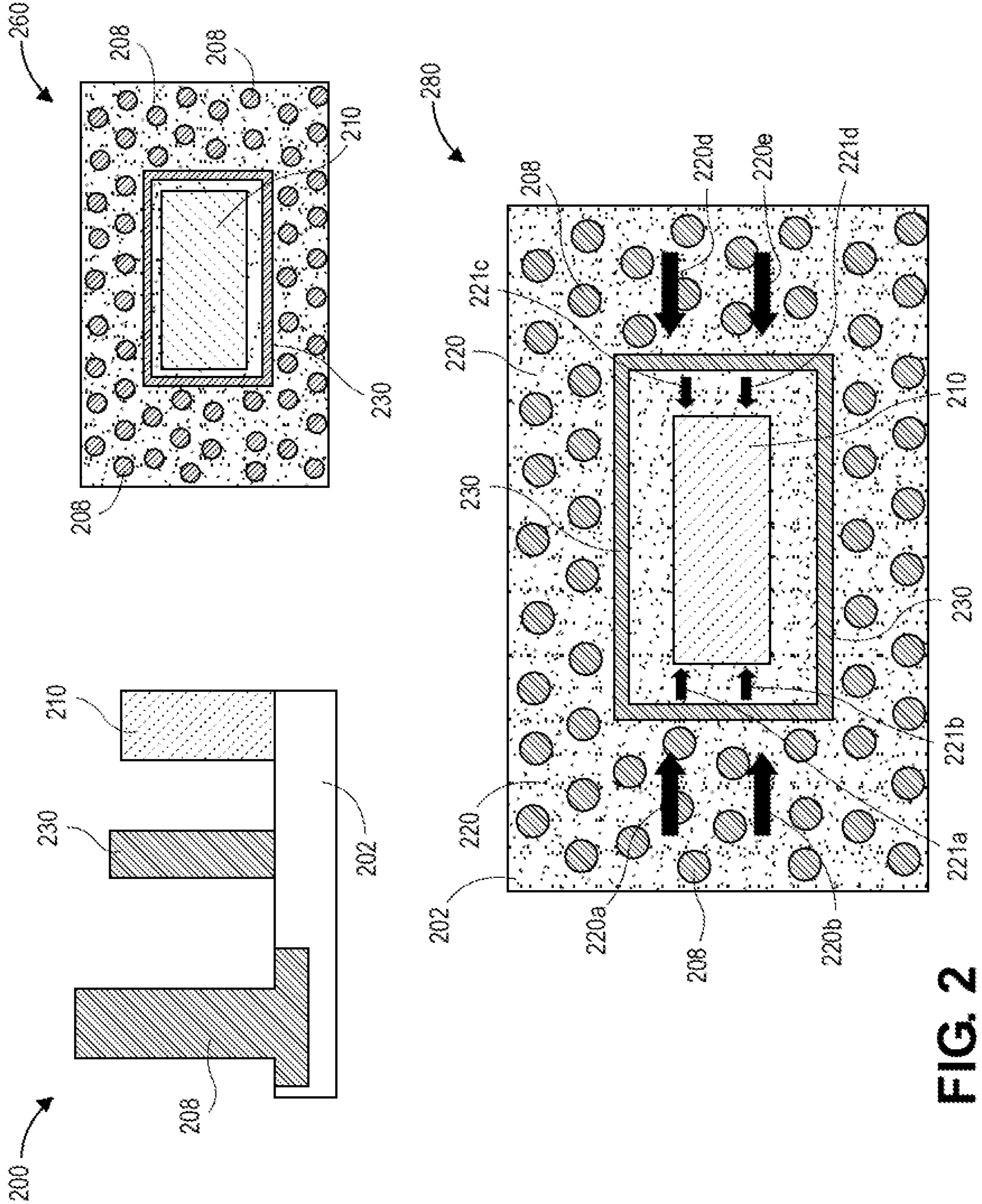
FIG. 2 illustrates block diagrams of a dam that surrounds a die on a substrate to reduce the risk of a die shift, in accordance with various embodiments.

FIG. 2 illustrates block diagrams of a dam that surrounds a die on a substrate to reduce the risk of a die shift, in accordance with various embodiments. Partial package 200, which may be similar to package 100 of FIG. 1, is a cross-section side view that includes a substrate 202, a pillar 208, and a die 210, which may be similar to substrate 102, pillar 108, and die 110 of FIG. 1. In embodiments, a dam 230 may be formed on the substrate 202. In embodiments, the dam 230 may be made of copper and may be formed using a copper plating process or some other copper buildup technique. The dam 230 may also be made of other materials. In embodiments, the dam 230 is not electrically coupled with the substrate 202.

Partial package 260, which may be similar to package 180 of FIG. 1, shows copper pillars 208, die 210, and dam 230. As shown, the dam 230 is in a shape similar to the die 210. In other embodiments, the shape of the dam 230 may be different from the shape of the die 210. In addition, spacing between the dam 230 and edges of the die 210 might not be uniform.

Partial package 280, which is similar to partial package 260, shows flow rates 220*a*, 220*b* and flow rates 220*d*, 220*e*, which may be similar to flow rates 120*a*, 120*b*, 120*d*, 120*e* of FIG. 1, as epoxy 220 is flowing toward the die 210. However, when the epoxy flow 220*a*, 220*b*, 220*d*, 220*e* encounter the dam 230, the flows 220*a*, 220*b*, 220*d*, 220*e* will go over the dam 230 and as a result the flow rates 221*a*, 221*b*, 221*c*, 221*d* are moderated, and as a result exert more even pressure on the edges of the die 210, which is less likely to cause the die to shift. In other embodiments, 220*a*, 220*b*, 220*d*, 220*e* are within an area of symmetric flow of epoxy that applies similar pressure to all sides of the die 210, which is less likely to cause the die to shift.

Figures 3A, 3B, 3C, 3D:
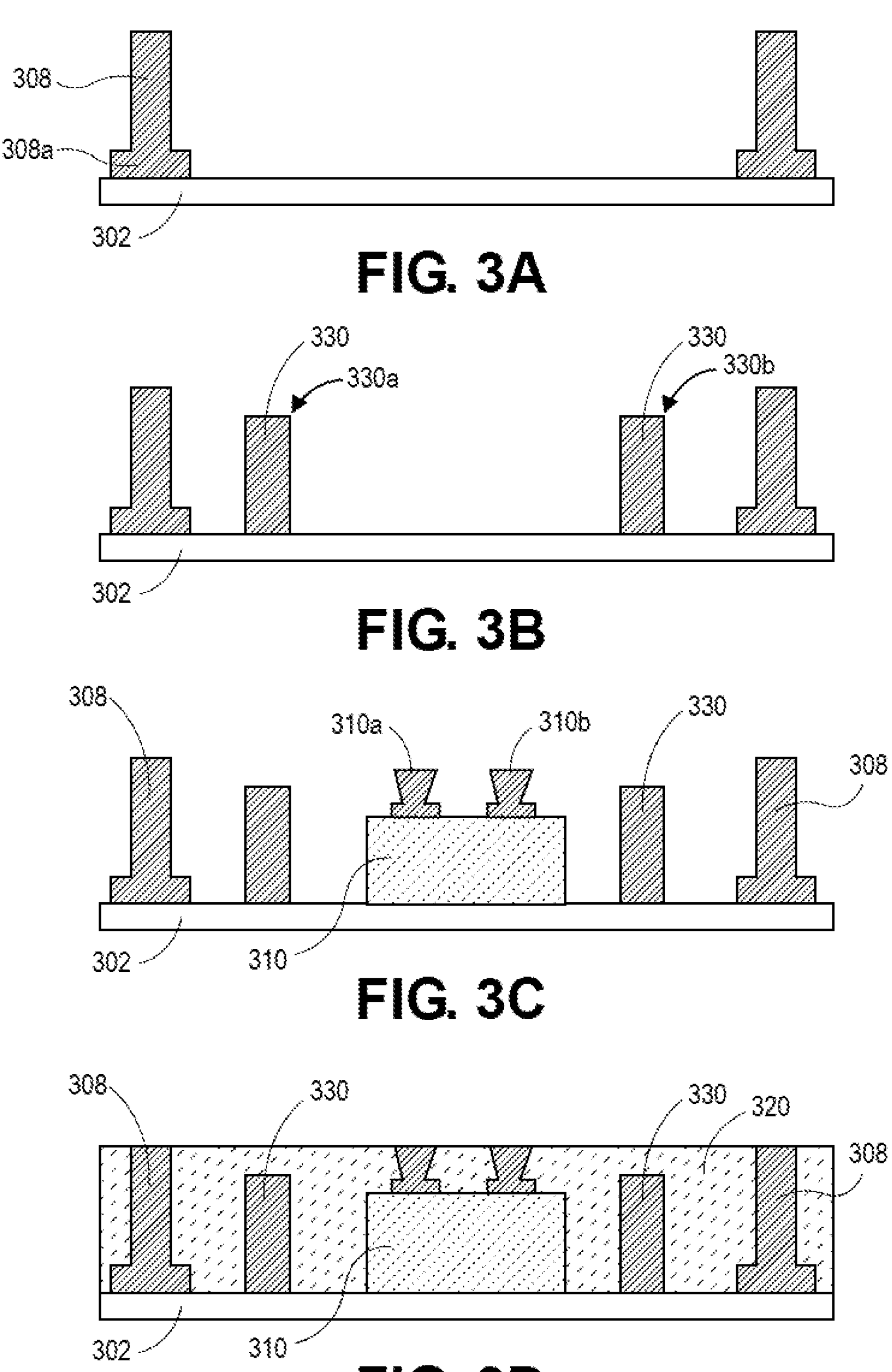
FIGS. 3A-3D illustrate stages in a manufacturing process for creating a dam on a substrate, in accordance with various embodiments.

FIG. 3A-3D illustrates cross-section side views of stages in a manufacturing process for creating a dam on a substrate, in accordance with various embodiments. FIG. 3A shows a stage in the manufacturing process where a pillars 308, which may be similar to pillars 208 of FIG. 2, are formed on the substrate 302, which may be similar substrate 202 of FIG. 2. The pillars 308 may be made of a conductive material, in particular copper. Pillars 308 may be formed using a variety of techniques, including copper plating. In embodiments, a pad 308*a* may also be formed on the surface of the substrate 302, and electrically and physically couple with the pillar 308. In embodiments, the pad 308*a* may be completely recessed or partially recessed within the substrate 302.

FIG. 3B shows a stage in the manufacturing process where a dam 330, which may be similar to dam 230 of FIG. 2, is formed on the substrate 302. In embodiments, the dam 330 may include copper, and may be formed using a variety of techniques, including copper plating. In embodiments, the dam 330 may completely enclose an area on the substrate 302 as shown with respect to dam 230 of FIG. 2. In other embodiments, the dam 330 may only partially enclose an area on the substrate 302. A height of the dam 330*a*, 330*b*, from the surface of the substrate 302 may be the same along the structure of the dam 330, or may be varied depending upon substrate 302 geometry, and/or speed and directions of epoxy flow 220*a*, 220*b*, 220*d*, 220*e* as shown in FIG. 2, as well as other manufacturing conditions.

FIG. 3C shows a stage in the manufacturing process where a die 310, which may be similar to die 210 of FIG. 2, is coupled with the surface of the substrate 302. In embodiments, electrical contacts 310*a* 310*b*, which may include copper, may be coupled to a surface of the die 310 for subsequent electrical coupling in the manufacturing process.

FIG. 3D shows a stage in the manufacturing process wherein encapsulation material 320, which may be similar to epoxy material 220 of FIG. 2, may be applied to cover elements that include the copper pillars 308, dam 330, die 310, and substrate 302. In embodiments, the application of the encapsulation material 320 may be accomplished by flowing the encapsulation material 320 around and through the plurality of copper pillars 308, and over the dam 300. As discussed with respect to FIG. 2, the encapsulation material 320 flowing over the dam 330 will cause differences in speed and direction of a flow of the encapsulation material and will cause symmetric encapsulation material 320 flow inside of the dam 330 and proximate to the die 310. As a result, the die 310 will be less likely to shift from its original attach position as shown with respect to FIG. 3C.

Figure 4A:
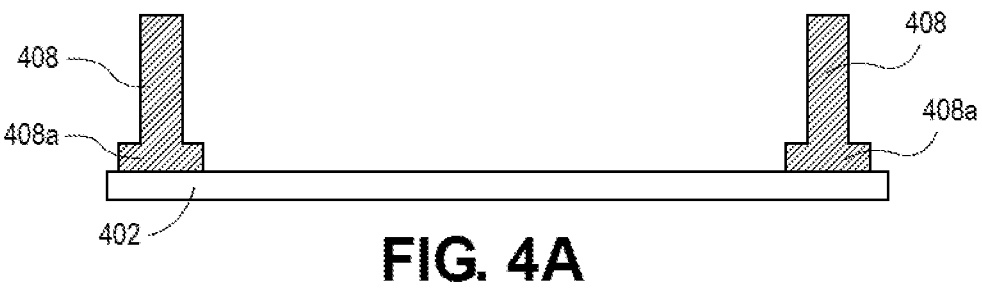
FIGS. 4A-4C illustrate stages in a manufacturing process for attaching a die in an open cavity within a substrate and encapsulating the die, in accordance with various embodiments.

FIG. 4 illustrates cross-section side views of stages in a manufacturing process for attaching a die in an open cavity within a substrate and encapsulating the die, in accordance with various embodiments. FIG. 4A shows a stage in the manufacturing process where a plurality of pillars 408, which may be similar to pillars 208 of FIG. 2, are formed onto the substrate 402, which may be similar to substrate 202 of FIG. 2. Pillars 408 may be formed using a variety of techniques, including copper plating. In embodiments, a pad 408*a* may also be formed on the surface of the substrate 402 that electrically and physically couples with the pillar 408. In embodiments, the pad 408*a* may be completely recessed or partially recessed within the substrate 402.

Figure 4B:
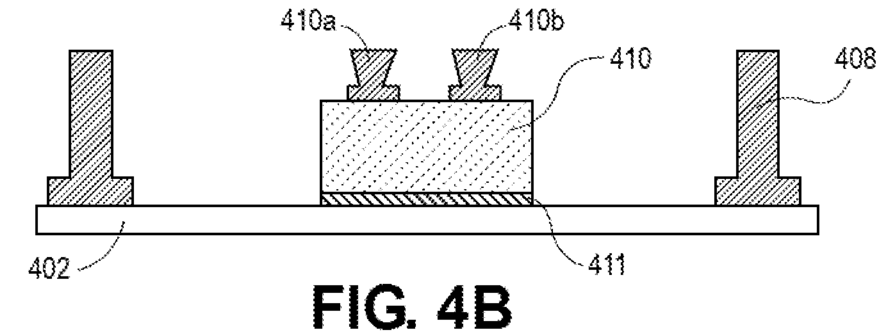

FIG. 4B shows a stage in the manufacturing process where a die 410, which may be similar to die 210 of FIG. 2, is coupled with the surface of the substrate 402. In embodiments, electrical contacts 410*a*, 410*b*, which may include copper, may be coupled to a surface of the die 410 for subsequent electrical coupling, for example with a top die (not shown). In embodiments, the die 410 may be placed on a layer 411 between the die 410 and the substrate 402. In embodiments, this layer 411 may be a dielectric or die bonding film. In other embodiments, the layer 411 may be an active electrical routing layer to electrically couple the die 410 to the substrate 402.

Figure 4C:
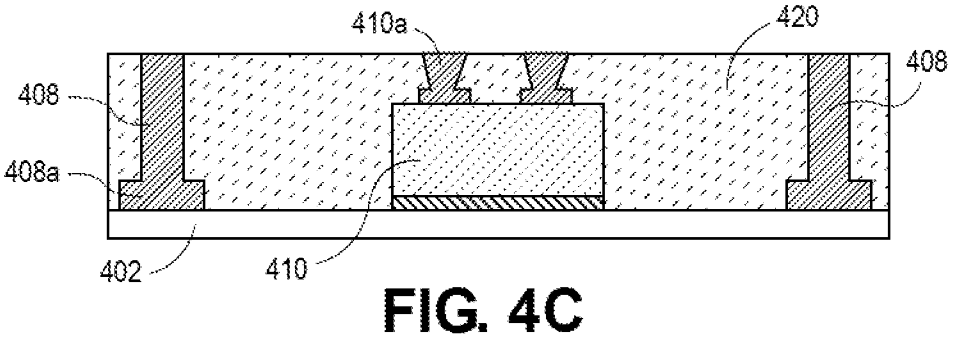

FIG. 4C shows a stage in the manufacturing process wherein encapsulation material 420, which may be similar to epoxy material 220 of FIG. 2, may be applied to cover elements of the plurality of copper pillars 408, die 410, and substrate 402. In embodiments, the application of the encapsulation material 420 may be accomplished by flowing the encapsulation material 420 around and through the plurality of copper pillars 408. However, without a dam structure such as that of dam 330 of FIG. 3D, the die 410 may be subject to uneven forces by the encapsulation material 420 flow that may cause the die 410 to shift.

Figures 5A, 5B, 5C, 5D:
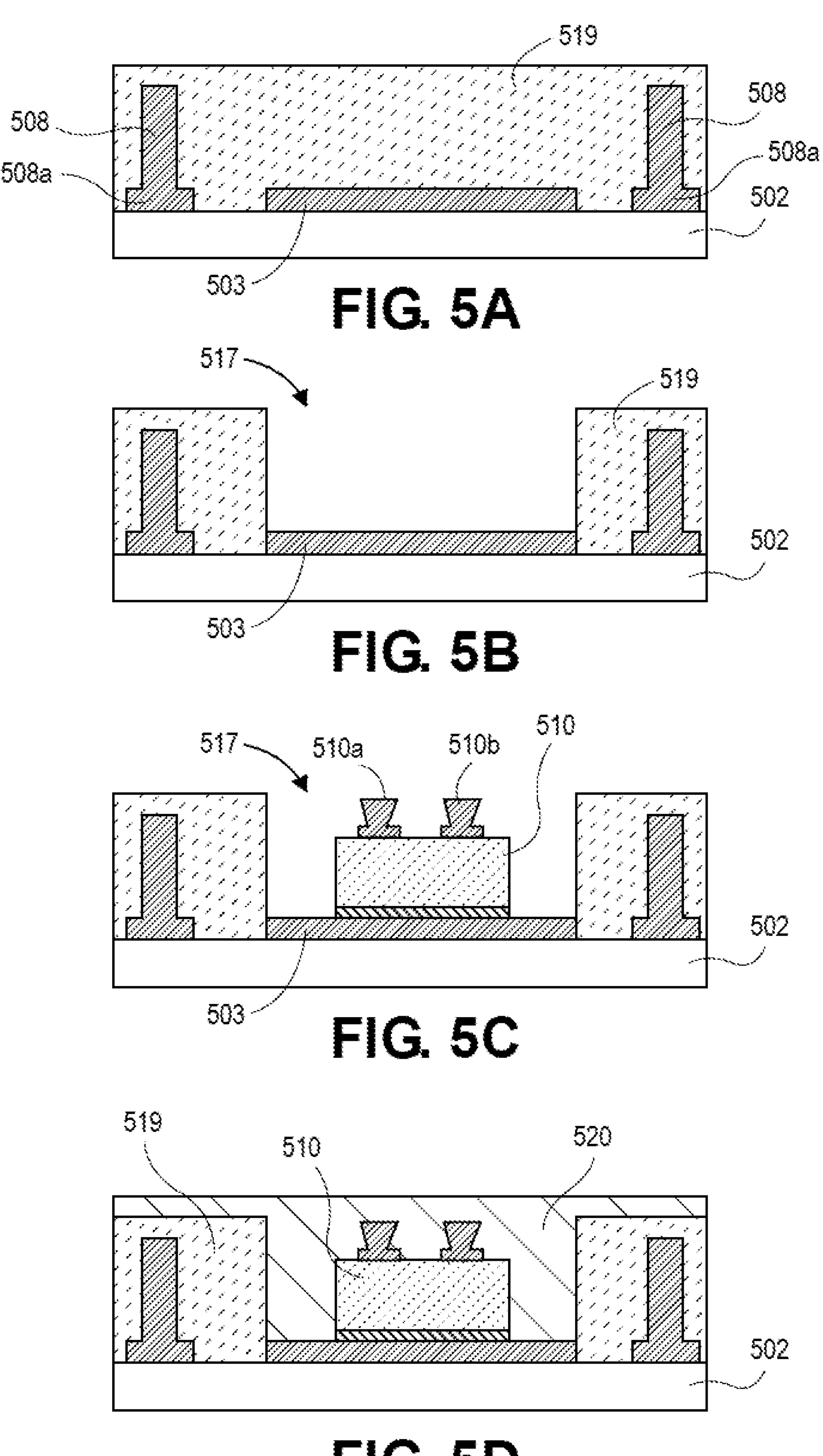
FIGS. 5A-5D illustrate stages in the manufacturing process for attaching a bridge in a cavity within a substrate and encapsulating the bridge, in accordance with various embodiments.

FIG. 5 illustrates cross-section side views of stages in the manufacturing process for attaching a bridge in a cavity within a substrate and encapsulating the bridge, in accordance with various embodiments. FIG. 5A shows a stage in the manufacturing process where a plurality of pillars 508, which may be similar to pillars 208 of FIG. 2, are formed onto the substrate 502, which may be similar to substrate 202 of FIG. 2. Pillars 508 may be formed using a variety of techniques, including copper plating. In embodiments, a pad 508*a* may also be formed on the surface of the substrate 502 that electrically and physically couples with the pillar 508. In embodiments, the pad 508*a* may be completely recessed or partially recessed within the substrate 502. In embodiments, a conductive layer 503 may be coupled with the substrate 502, and may be positioned between the pillars 508. An encapsulation material 519 may encapsulate the pillars 508, conductive layer 503, and substrate 502.

FIG. 5B shows a stage in the manufacturing process where a cavity 517 is drilled into the encapsulation material 519, exposing the conductive layer 503.

FIG. 5C shows a stage in the manufacturing process where a die 510, which may be similar to die 210 of FIG. 2, is electrically and/or physically coupled to the conductive layer 503 within the cavity 517. In embodiments, the die 510 may be placed on the layer 503 between the die 510 and the substrate 502. In embodiments, electrical contacts 510*a*, 510*b*, which may include copper, may be coupled to a surface of the die 510 for subsequent electrical coupling with the die 510.

FIG. 5D shows a stage in the manufacturing process where a second encapsulation layer 520 is flowed over the encapsulation material 519, the substrate 502, the conductive layer 503, and the die 510. In embodiments, the encapsulation material 519 and the second encapsulation layer 520 may include the same materials or different materials.

Figure 6:
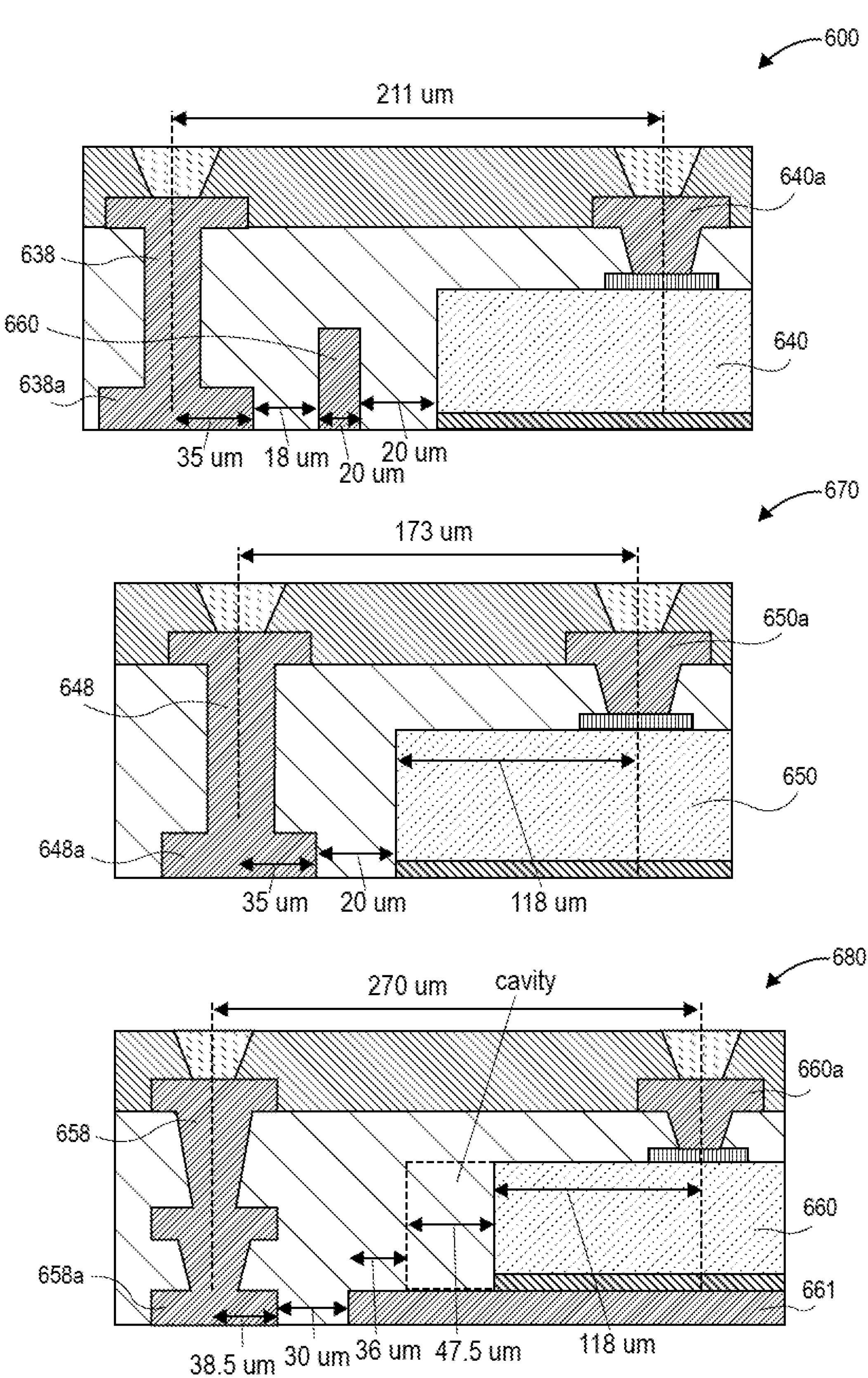
FIG. 6 illustrates examples of various packaging design rules, in accordance with various embodiments.

FIG. 6 illustrates examples of various packaging design rules, in accordance with various embodiments. Package 600 is a cross-section side view and is directed to design rules for a dam structure, which may be referred to as a pseudo-cavity. Package 600 may be similar to a portion of the package of FIG. 3D. Package 600 includes a copper pillar 638 coupled with a copper pad 638*a*, which may be similar to copper pillar 308 and copper pad 308*a* of FIG. 3D. Dam 660 may be similar to dam 330 of FIG. 3D. Die 640 and electrical contact 640*a* may be similar to die 310 and electrical contact 310*a* of FIG. 3D.

Package 670 is a cross-section side view and is directed to design rules an open cavity. Package 670 may be similar to a portion of the package of FIG. 4C. Package 670 includes a copper pillar 648 coupled with a copper pad 648*a*, which may be similar to copper pillar 408 and copper pad 408*a* of FIG. 4C. Die 650 and electrical contact 650*a* may be similar to die 410 and electrical contact 410*a* of FIG. 4C.

Package 680 is a cross-section side view and is directed to design rules for EMIBs, and may be similar to portions of the package of FIG. 5D. Package 680 includes a copper pillar 658 coupled with a copper pad 658*a*, which may be similar to copper pillar 508 and copper pad 508*a* of FIG. 5D. Die 660 and electrical contact 660*a* may be similar to die 510 and electrical contact 510*a* of FIG. 5D For each of the features described above for packages 600, 670, and 680 various distances shown in micrometers (μm) are shown between the edges of the various features and/or a centerline of the various features in a cross-section side view to indicate one example and/or one embodiment of possible geometries within the packages 600, 670, 680.

Figures 7A, 7B:
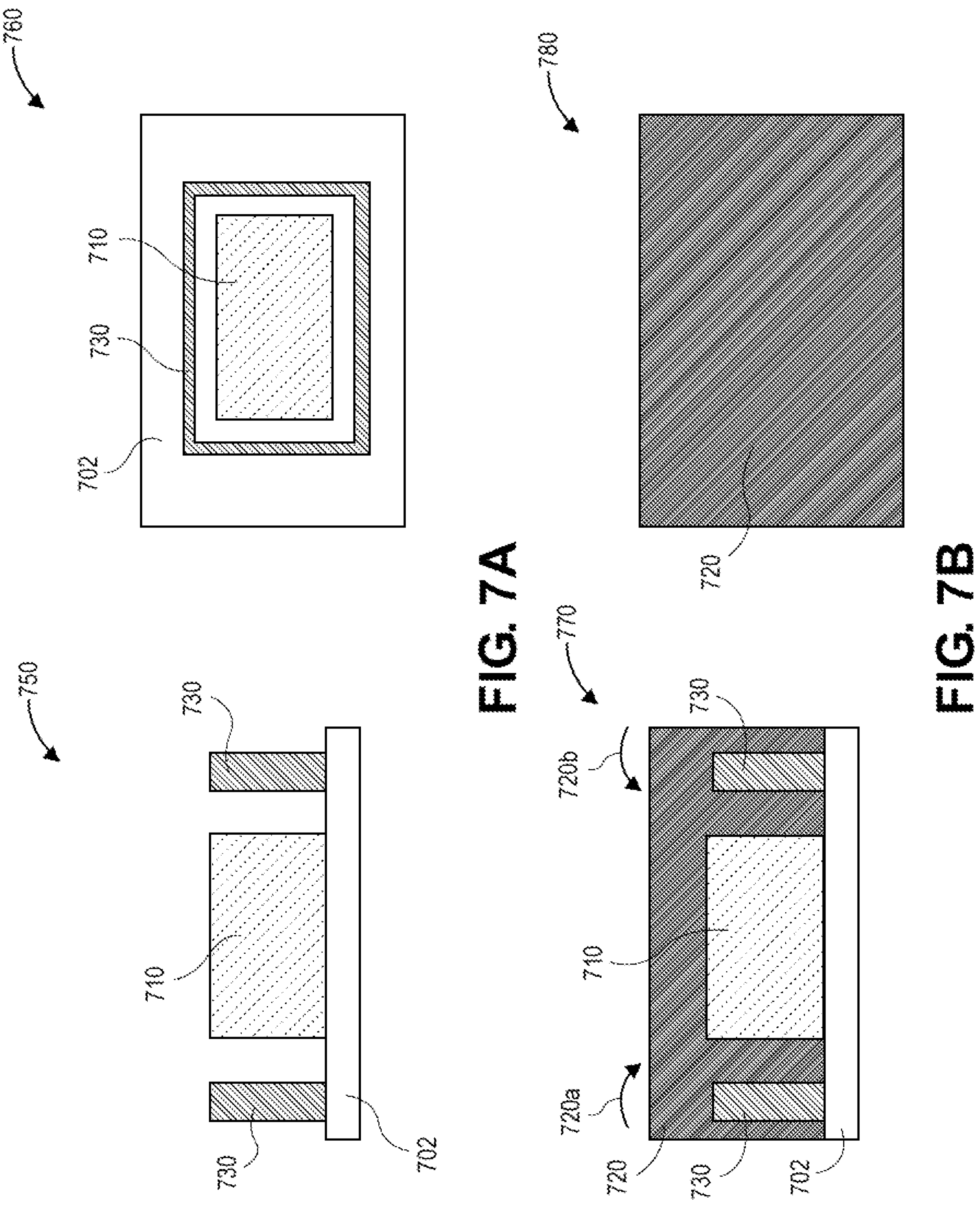
FIGS. 7A-7B illustrate an example of a dam on the substrate to reduce the risk of a die shift on the substrate, in accordance with various embodiments.

FIGS. 7A-7B illustrate an example of a dam on the substrate to reduce the risk of a die shift on the substrate, in accordance with various embodiments. FIG. 7A shows a cross-section side view 750 and a top-down view 760 of a partial package that includes a substrate 702, a die 710 coupled with the substrate 702, and a dam 730 coupled with the substrate 702. These may be similar to substrate 202, dam 230, and die 210 of FIG. 2. In embodiments, the dam 730 may completely surround the die 710. In addition, a height of the dam 730 may vary with respect to a height of the die 710.

FIG. 7B shows a cross-section view 770 and a top-down view 780 of an epoxy 720 that is flowed over the dam 730, resulting in a more even flow 720*a*, 720*b* of epoxy 720 against the sides of the die 710. As a result of this more even flow, symmetric or even pressure is put on the sides of the die 710, thus the die 710 is less likely to shift while the epoxy 720 is applied.

Figures 8A, 8B:
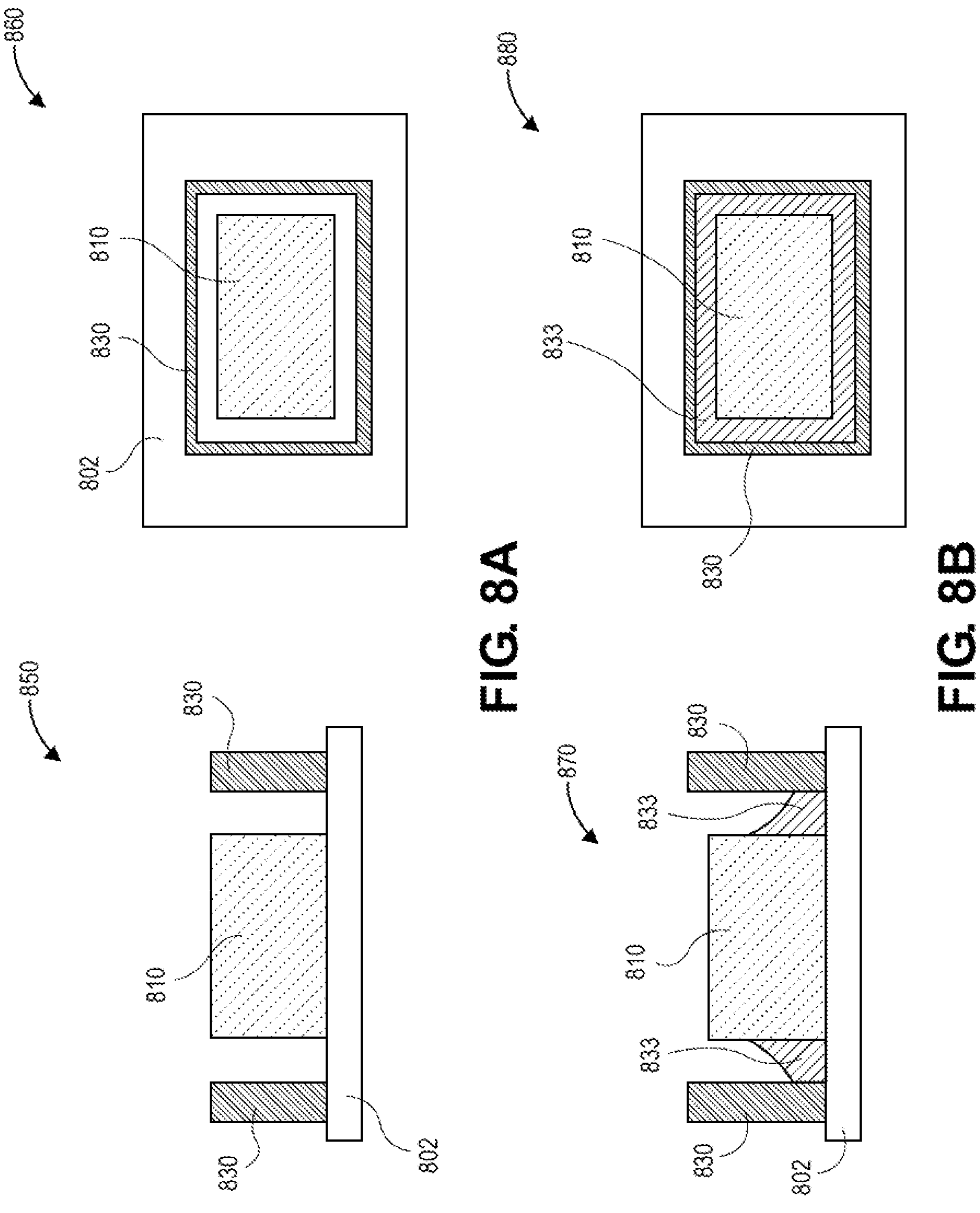
FIGS. 8A-8B illustrate an example of a dam surrounding a die on a substrate with a capillary underfill (CUF) between the dam and the die, in accordance with various embodiments.

FIGS. 8A-8B illustrate an example of a dam surrounding a die on a substrate with a CUF between the dam and the die, in accordance with various embodiments. FIG. 8A shows a cross-section side view 850 and a top-down view 860 of a partial package that includes a substrate 802, a die 810 coupled with substrate 802, and a dam 830 coupled with the substrate 802. These may be similar to substrate 202, dam 230, and die 210 of FIG. 2.

FIG. 8B shows a cross-section view 870 and a top-down view 880 where a CUF is inserted between the walls of the dam 830 and the walls of the die 810. In embodiments, the CUF 833 may be applied through a dispense process and flow due to capillary effects. In embodiments, the walls of the dam 830 will keep the CUF 833 from flowing outside of the area of the substrate 802 enclosed by the dam 830. In addition, the dam 830 will allow greater control of a height level of the CUF 833 as it is inserted next to the die 810. In this way, the dam 830 will help facilitate a tighter physical connection between the die 810 and the substrate 802 by controlled placement of the CUF 833.

Figures 9A, 9B:
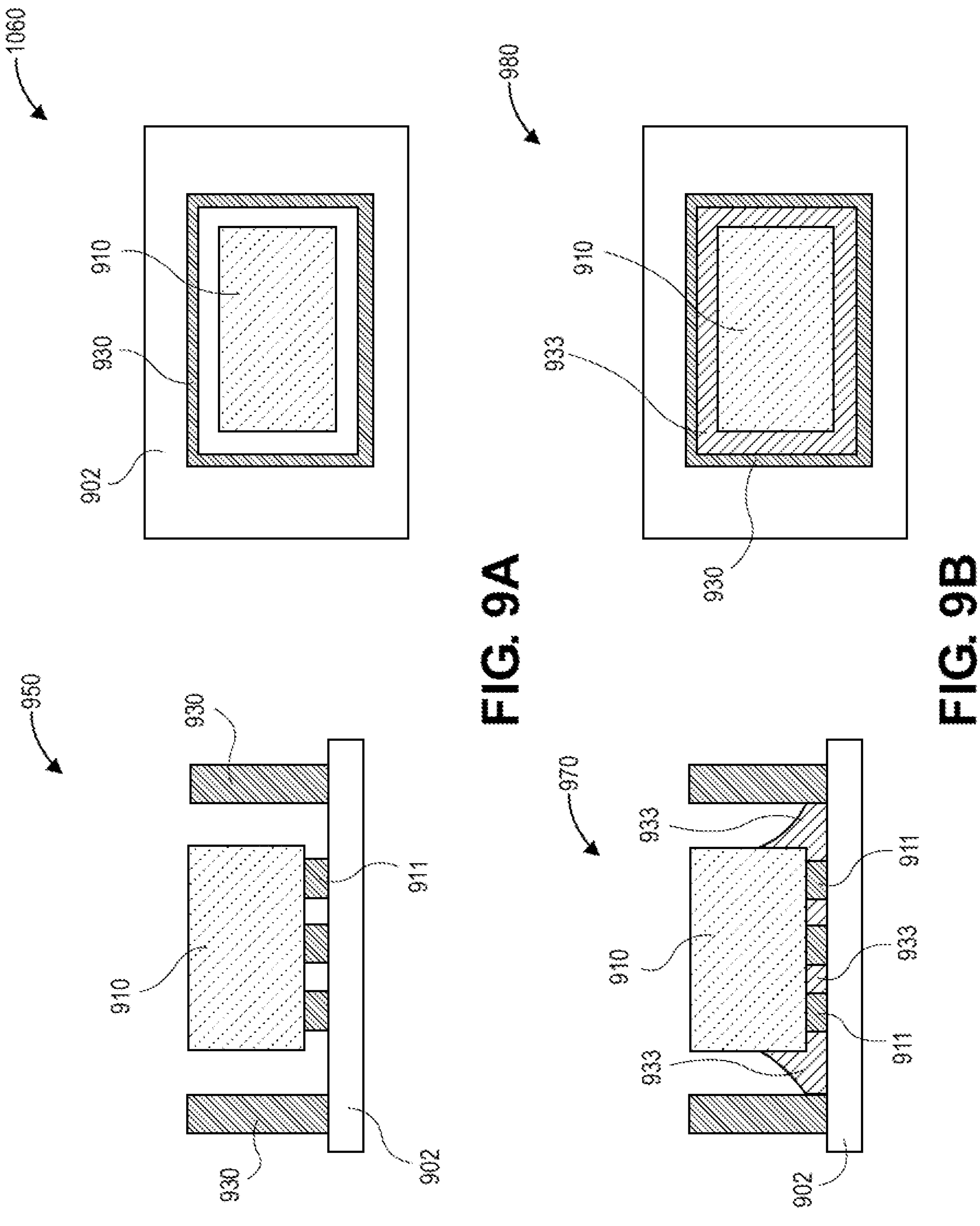
FIGS. 9A-9B illustrate another example of a dam surrounding a die on a substrate with a CUF between the dam and the die and flowing under the die, in accordance with various embodiments.

FIGS. 9A-9B illustrate another example of a dam surrounding a die on a substrate with a CUF between the dam and the die and flowing under the die, in accordance with various embodiments. FIG. 9A shows a cross-section side view 950 and a top-down view 960 of a partial package that includes a substrate 902, a die 910 coupled with substrate 902, and a dam 930 coupled with the substrate 902. These may be similar to substrate 202, dam 230, and die 210 of FIG. 2. In addition, one or more electrical connections 911 couple the die 910 with the substrate 902. In embodiments, these electrical connections 911 may be implemented as bumps.

FIG. 9B shows a cross-section view 970 and a top-down view 980 where a CUF is inserted between the walls of the dam 930 and the walls of the die 910. In embodiments, the walls of the dam 930 will keep the CUF 933 from flowing outside of the area of the substrate 902 enclosed by the dam 930. In addition, the dam 930 will allow greater control of a height level of the CUF 933 as it is inserted next to the die 910. The dam 930 will cause the CUF 933 to flow underneath the die 910, and around the electrical connections 911, to facilitate tighter physical and electrical coupling between the die 910 and the substrate 902.

Figures 10A, 10B:
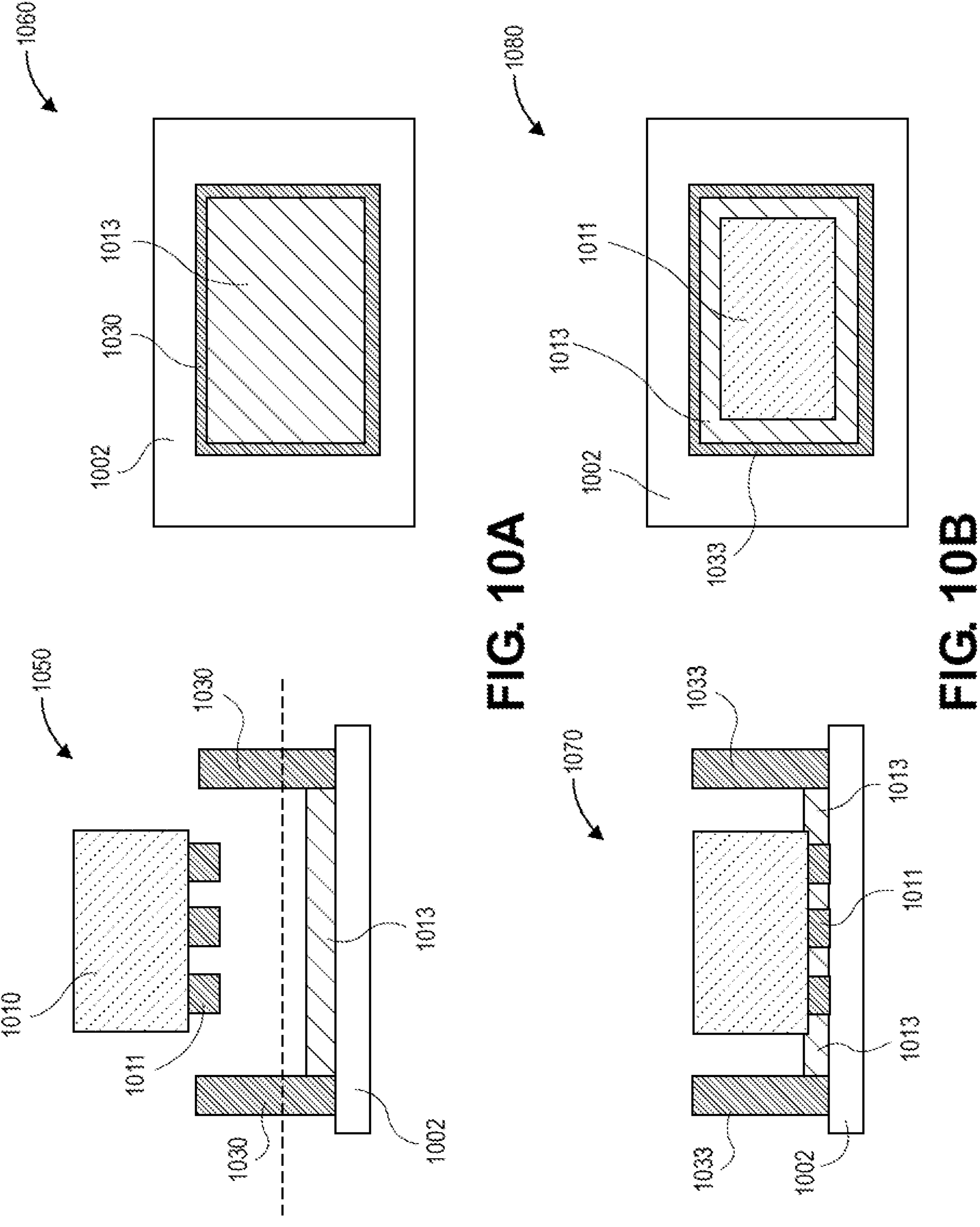
FIGS. 10A-10B illustrate an example of a dam surrounding a portion of a substrate that includes liquid flux into which a die is inserted, in accordance with various embodiments.

FIGS. 10A-10B illustrate an example of a dam surrounding a portion of a substrate that includes liquid flux into which a die is inserted, in accordance with various embodiments. FIG. 10A shows a cross-section side view 1050 and a top-down view 1060 of a partial package that includes a substrate 1002, a die 1010 coupled with substrate 1002, and a dam 1030 coupled with the substrate 1002. These may be similar to substrate 202, dam 230, and die 210 of FIG. 2. In addition, one or more electrical connections 1011 couple with the die 1010. In embodiments, these electrical connections 1011 may be implemented as bumps. A liquid flux 1013 may be placed on top of the substrate 1002 and between the walls of the dam 1030. The dam 1030 will serve to provide control over the amount of flux to which the electrical connections 1011 are subjected.

FIG. 10B shows a cross-section view 1070 and a top-down view 1080 where the electrical connections 1011 and/or portions of the die 1010 are immersed into the flux 1013, and coupled with the substrate 1002. In the embodiments, the walls of the dam 1033 will keep the flux 1013 from flowing outside the area of the substrate 1002 enclosed by the dam 1033. As a result, this may improve control over solder joint creation.

Figures 11A, 11B:
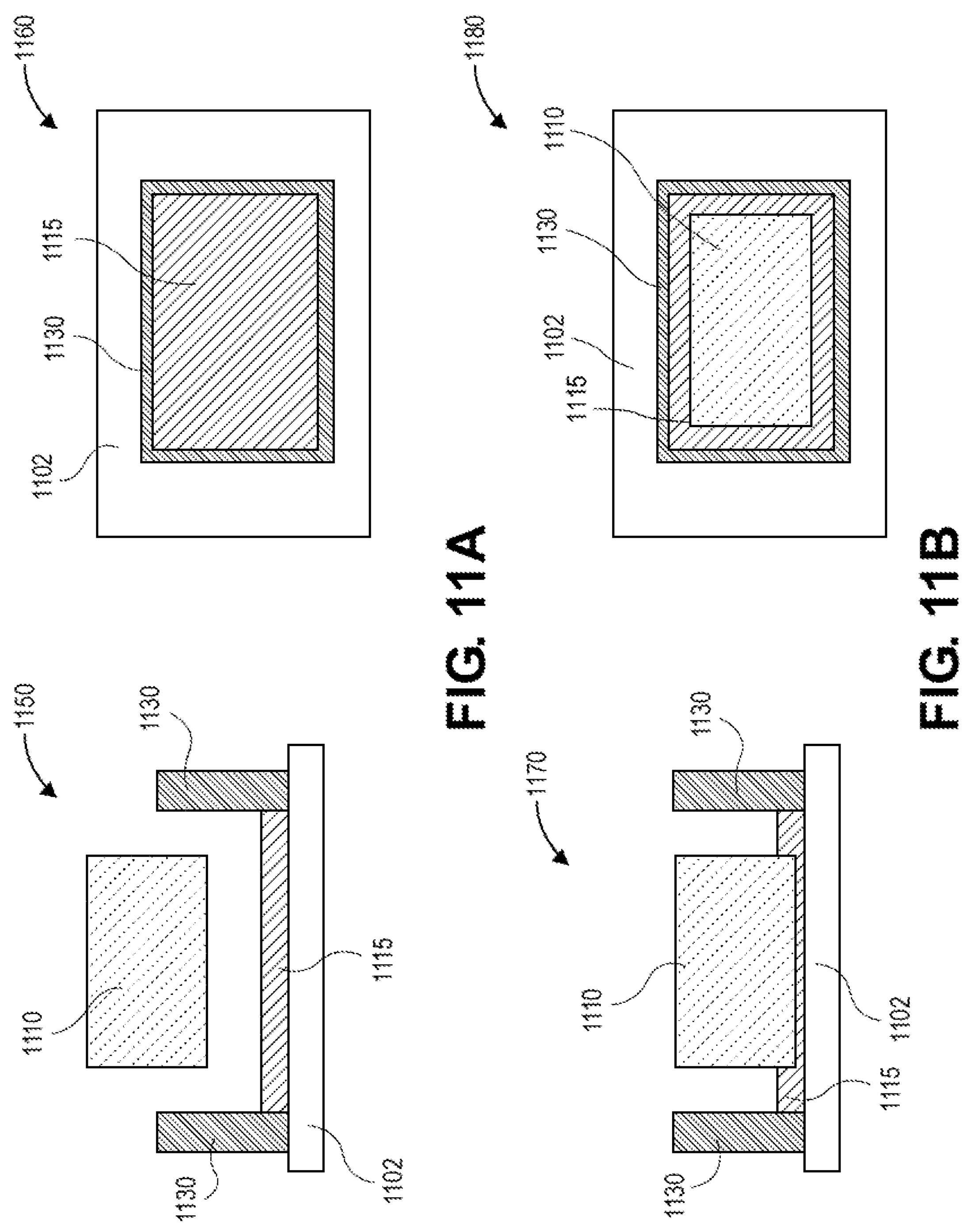
FIGS. 11A-11B illustrate an example of a dam surrounding a portion of a substrate that includes a liquid die bond film (DBF) into which a die is inserted, in accordance with various embodiments.

FIGS. 11A-11B illustrate an example of a dam surrounding a portion of a substrate that includes a liquid die bond film (DBF) into which a die is inserted, in accordance with various embodiments. FIG. 11A shows a cross-section side view 1150 and a top-down view 1160 of a partial package that includes a substrate 1102, a die 1110 coupled with substrate 1102, and a dam 1130 coupled with the substrate 1102. These may be similar to substrate 202, dam 230, and die 210 of FIG. 2. A liquid die bonding film (DBF) 1115 may be placed on top of the substrate 1102 and between the walls of the dam 1130. The dam 1130 will serve to provide control over the amount of DBF 1115 to which the die 1110 is subjected.

FIG. 11B shows a cross-section view 1170 and a top-down view 1180 where the portions of the die 1110 are immersed into the DBF 1115 and coupled with the substrate 1102. As a result, this may improve control over solder joint creation. In other embodiments, the walls of the dam 1130 will keep the liquid DBF material from flowing outside the area of the substrate 1102 enclosed by the dam 1130. As a result, the die 1110 can be coupled with the substrate 1102 by liquid DBF.

FIGS. 12A-12D illustrate cross-section side views of stages in the manufacturing process where tall pillars and a dam structure are created on the substrate, in accordance with various embodiments. The manufacturing process may be used to create the pillars 1208 and dam 1230 of FIG. 12D, and may be similar to pillars 208 and dam 230 of FIG. 2, pillars 308 and dam 330 of FIG. 3D, pillars 638 and dam 660 of FIG. 6, dam 730 of FIG. 7B, dam 830 of FIG. 8B, dam 930 of FIG. 9B, dam 1030 of FIG. 10B, and/or dam 1130 of FIG. 11B.

Figure 12A:
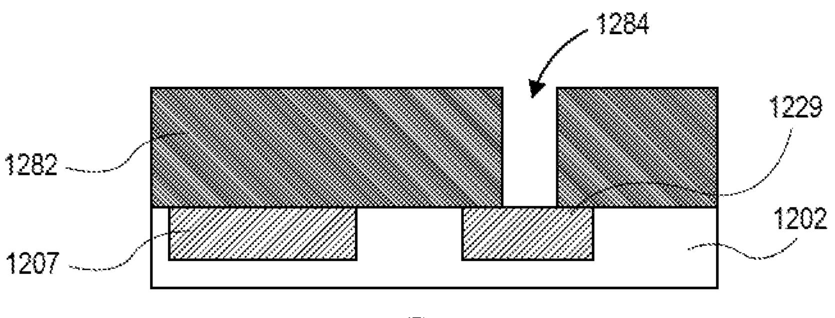
FIGS. 12A-12D illustrate stages in the manufacturing process where tall pillars and a dam structure are created on the substrate, in accordance with various embodiments.

FIG. 12A illustrates a stage in the manufacturing process where a substrate 1202, which may be similar to substrate 202 of FIG. 2, is formed and includes a pillar pad 1207 and a dam pad 1229. In embodiments, the pillar pad 1207 and the dam pad 1229 may be copper pads. A dry film resist (DFR) layer 1282 may be formed on top of the substrate 1202. A first cavity 1284 may be etched in the DFR layer 1282 to expose the dam pad 1229.

Figure 12B:
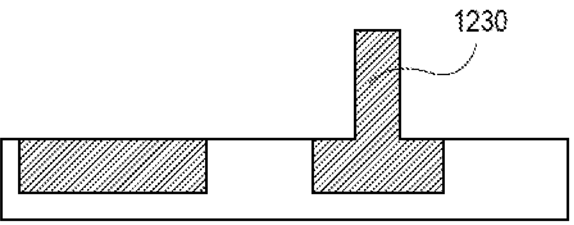

FIG. 12B illustrates a stage in the manufacturing process where the dam 1230 is formed, and the DFR 1282 is stripped away. In embodiments, the dam 1230 may be a copper dam, and may be formed by using copper plating or other copper buildup techniques.

Figure 12C:
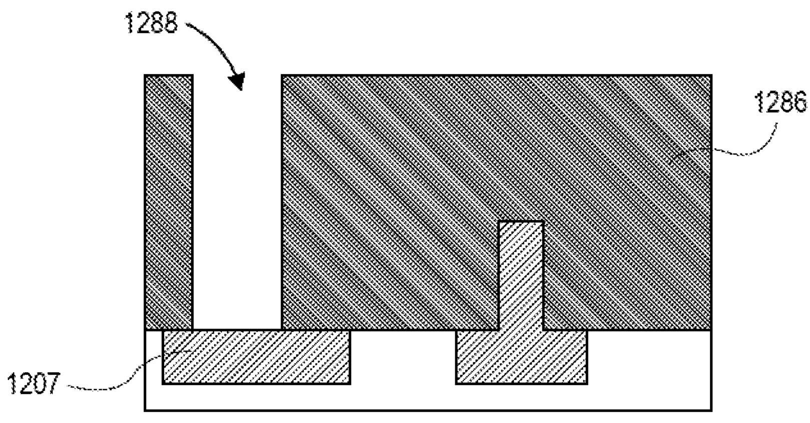

FIG. 12C illustrates a stage in the manufacturing process where a second DFR 1286 is applied, and a second cavity 1288 is etched in the DFR 1286 above the pillar pad 1207. Note that a height and/or a width of the second cavity 1288 may be different than a height and/or width of the first cavity 1284.

Figure 12D:
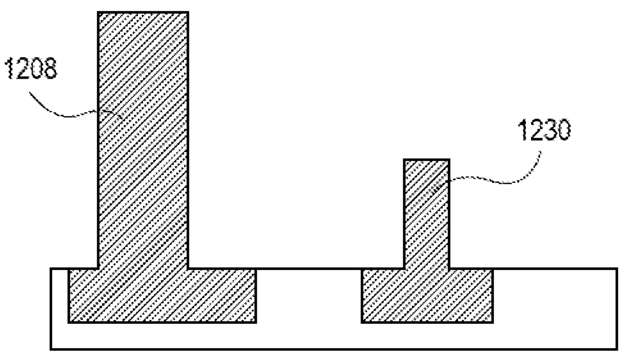

FIG. 12D illustrates a stage in the manufacturing process where a pillar 1208 is formed within the second cavity 1288, and the DFR 1286 is removed.

Figure 13A:
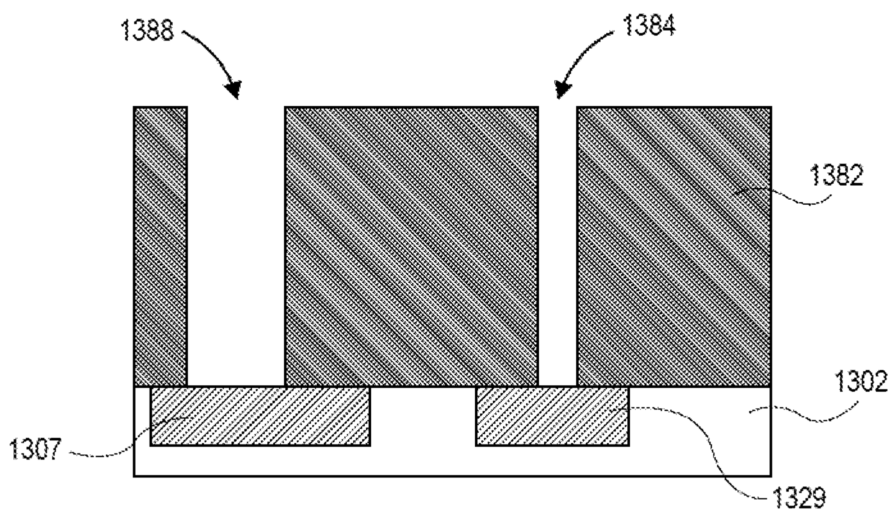
FIGS. 13A-13B illustrate stages in another manufacturing process where tall pillars and a dam structure are created on a substrate, in accordance with various embodiments.
Figure 13B:
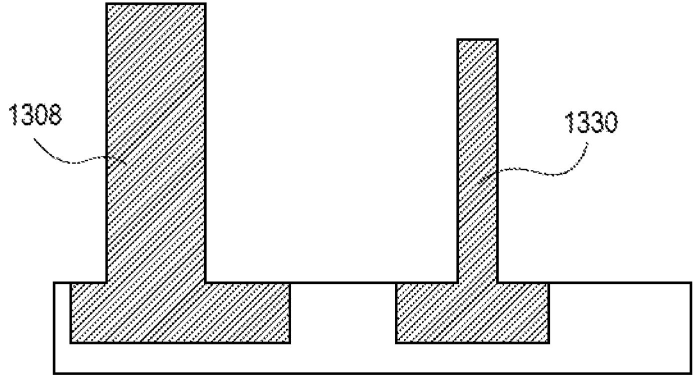

FIGS. 13A-13B illustrate stages in another manufacturing process where tall pillars and a dam structure are created on the substrate in a same step, in accordance with various embodiments. FIG. 13A shows a stage in the manufacturing process where a substrate 1302, a pillar pad 1307, and a dam pad 1329 are formed within the substrate 1302. In embodiments, these may be similar to substrate 1202, pillar pad 1207, and dam pad 1229 of FIG. 12A. A DFR 1382 may be applied to a surface of the substrate 1302, and then a first cavity 1384 may be etched within the DFR 1382 to expose the dam pad 1329, and a second cavity 1388 may be etched within the DFR 1382 to expose the pillar pad 1307.

FIG. 13B shows a stage in the manufacturing process where dam 1330 is formed by filling first cavity 1384 with copper or some other material. Pillar 1308 is formed by filling the second cavity 1388 with copper or some other material and the DFR 1382 is removed.

Figure 14:
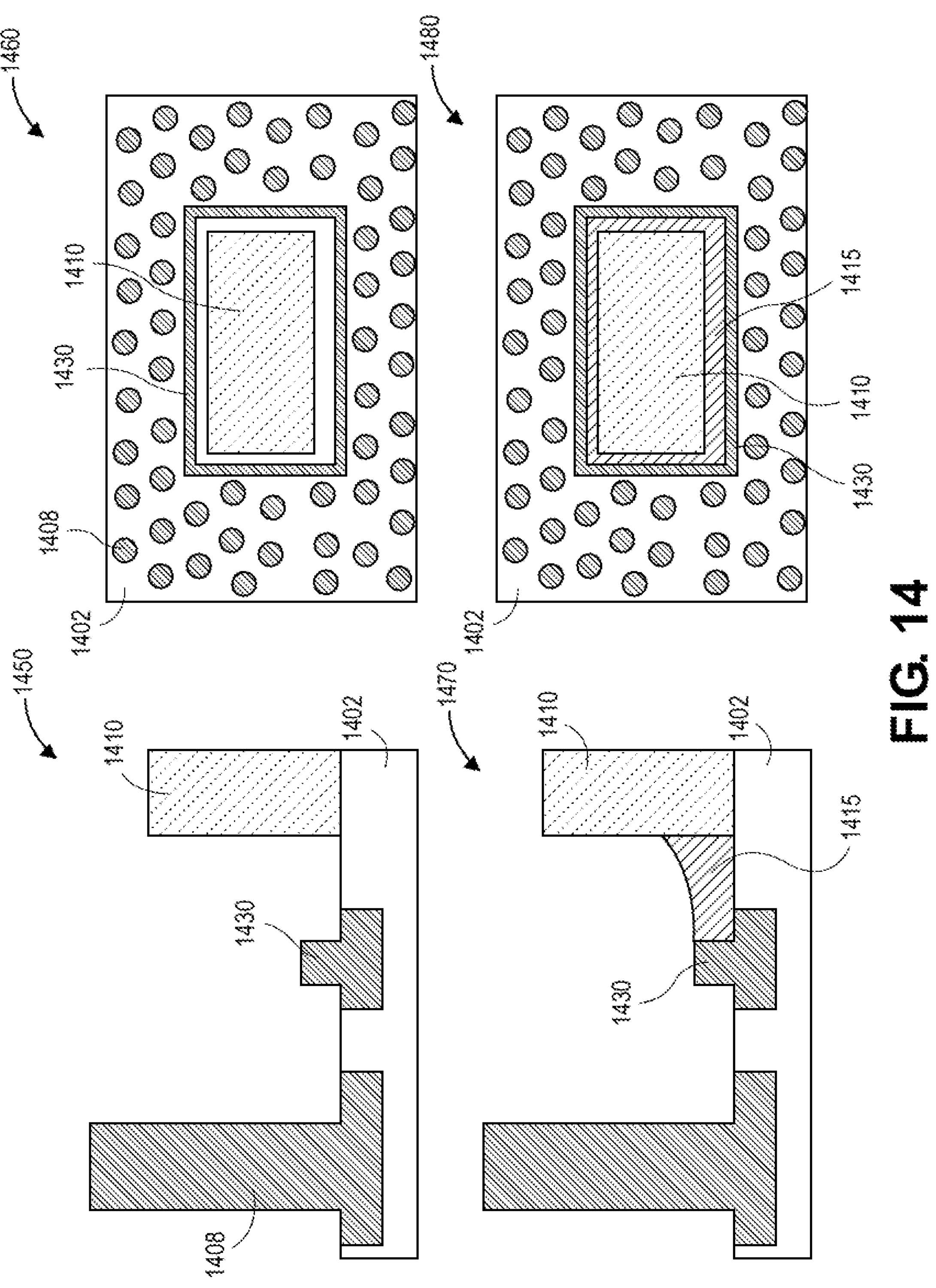
FIG. 14 illustrates an example of a low aspect ratio dam surrounding a die, where a dielectric material is proximate to a surface of a substrate and coupled with the dam and a die, in accordance with various embodiments.

FIG. 14 illustrates an example of a low aspect ratio dam surrounding a die, where a dielectric material is proximate to a surface of a substrate and coupled with the dam and a die, in accordance with various embodiments. Diagram 1450 shows a cross-section side view and diagram 1460 shows a top-down view of a substrate 1402, with a plurality of pillars 1408 formed on the surface of the substrate 1402, and a dam 1430 formed on the surface of the substrate around a die 1410. As shown, a height of the dam 1430 is significantly less than a height of the pillar 1408 or the height of the die 1410. In embodiments, dam 1430 may be referred to as a low aspect ratio dam. As a result, a lower aspect ratio may increase the tolerance or the margin for both the dam 1430 creation process and placement accuracy of the die 1410.

Diagram 1470 shows a cross-section side view and diagram 1480 shows a top-down view of the substrate 1402 with the low aspect ratio dam 1430, with a dielectric material 1415 placed between the dam 1430 and a side of the die 1410. In embodiments, the dielectric material 1415, when cured, will facilitate the die 1410 staying in place on the substrate 1402 during manufacturing processes as described above, in particular with respect to flow to material over the substrate 1402.

Figure 15:
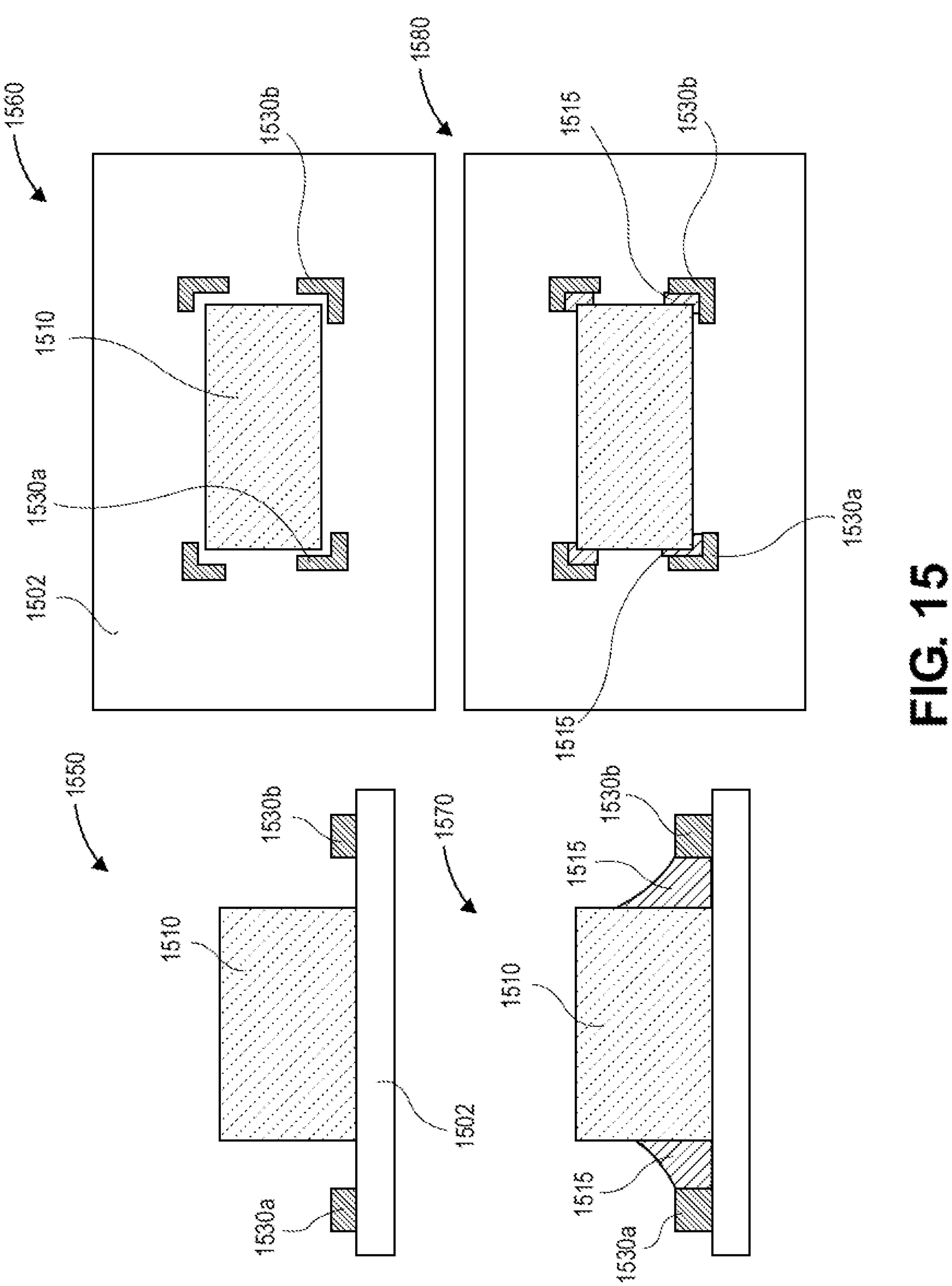
FIG. 15 illustrates an example of a low aspect ratio dam partially surrounding a die, where a dielectric material is proximate to the surface of the substrate and coupled with the dam and a portion of the die, in accordance with various embodiments.

FIG. 15 illustrates an example of a low aspect ratio dam partially surrounding a die, where a dielectric material is proximate to the surface of the substrate and coupled with the dam and a portion of the die, in accordance with various embodiments. Diagram 1550 shows a cross-section side view and diagram 1560 shows a top-down view of a substrate 1502, with a portions of a dam 1530*a*, 1530*b* formed on the surface of the substrate 1502 proximate to a die 1510.

Diagram 1570 shows a cross-section side view and diagram 1580 shows a top-down view of the substrate 1502 with the portions of the dam 1530*a*, 1530*b*, with a dielectric material 1515 placed, respectively, between the portions of a dam 1530*a*, 1530*b* and a side of the die 1510. In embodiments, the dielectric material 1515 will "tack" the die 1510 onto the substrate 1502 and facilitate the die 1510 staying in place on the substrate 1502 during manufacturing processes as described above, in particular with respect to flowing material over the substrate 1502. In embodiments, not using a full dam, such as dam 1415 of FIG. 14, may free up additional space on the substrate 1502 for electrically functional pillars or other features.

Figure 16:
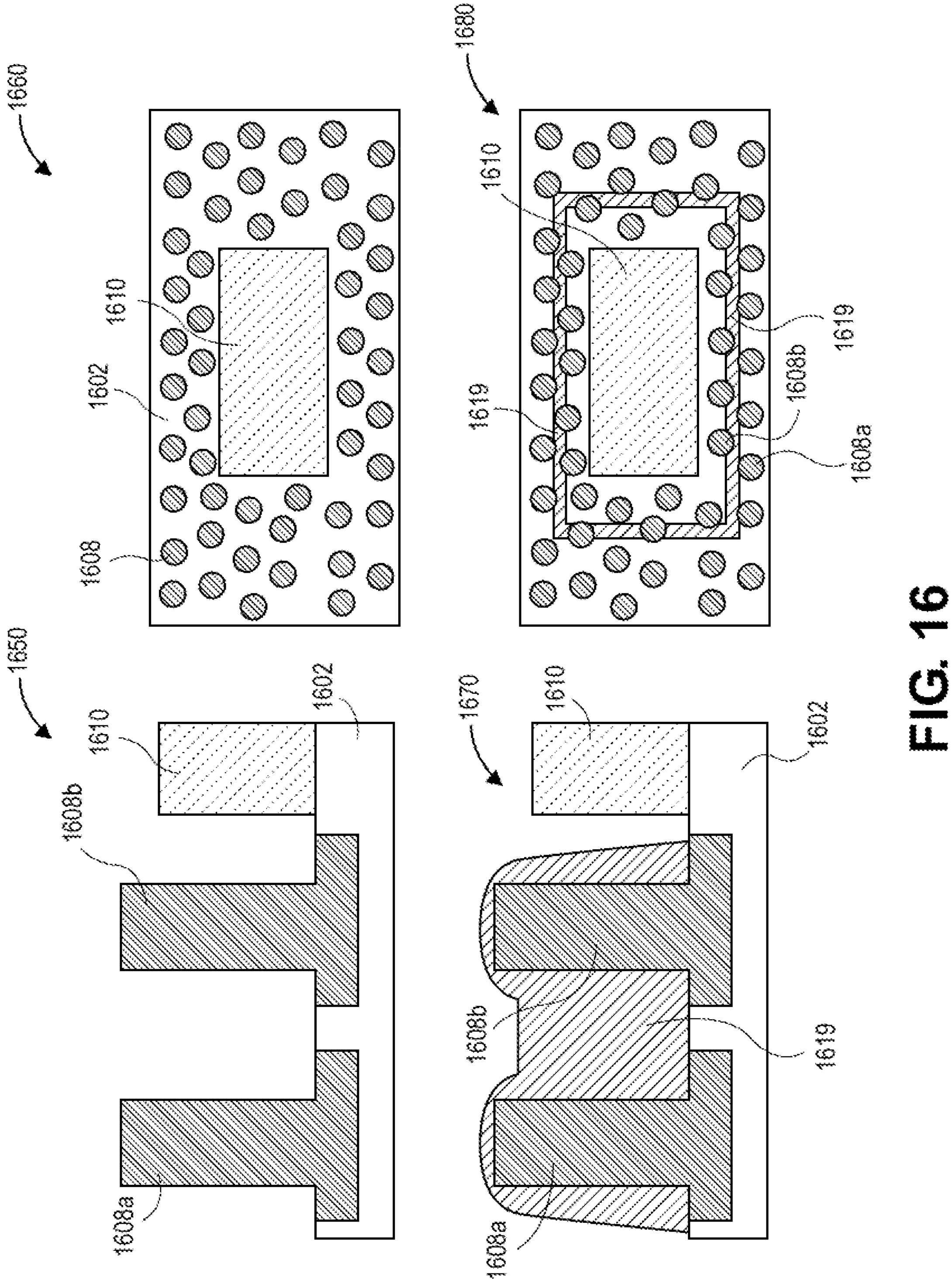
FIG. 16 illustrates an example of a dam surrounding a die on a substrate where the die includes dielectric material that is supported by one or more pillars on the substrate, in accordance with various embodiments.

FIG. 16 illustrates an example of a dam surrounding a die on a substrate where the die includes dielectric material that is supported by one or more pillars on the substrate, in accordance with various embodiments. Diagram 1650 shows a cross-section side view and diagram 1660 shows a top-down view of a substrate 1602, with pillars 1608, including pillars 1608*a*, 1608*b*, formed on the surface of the substrate 1602 proximate to a die 1610. In embodiments, the pillars 1608 may be similar to pillars 208 of FIG. 2.

Diagram 1670 shows a cross-section side view and diagram 1680 shows a top-down view of the substrate 1602, where a dielectric material 1619 is placed around the die 1610, and in physical contact with a subset of the pillars 1608, in particular pillars 1608*a*, 1608*b*. In embodiments, dielectric material 1619 will be supported by the pillars

1608*a*, 1608*b*, and may form a continuous dam feature around the die 1610. In embodiments, if the pillars 1608 are copper pillars, the structure will allow a continuous dam feature while still using electrical conductive properties of the pillars. In this way, the area of the substrate 1602 may be better utilized.

Figure 17:
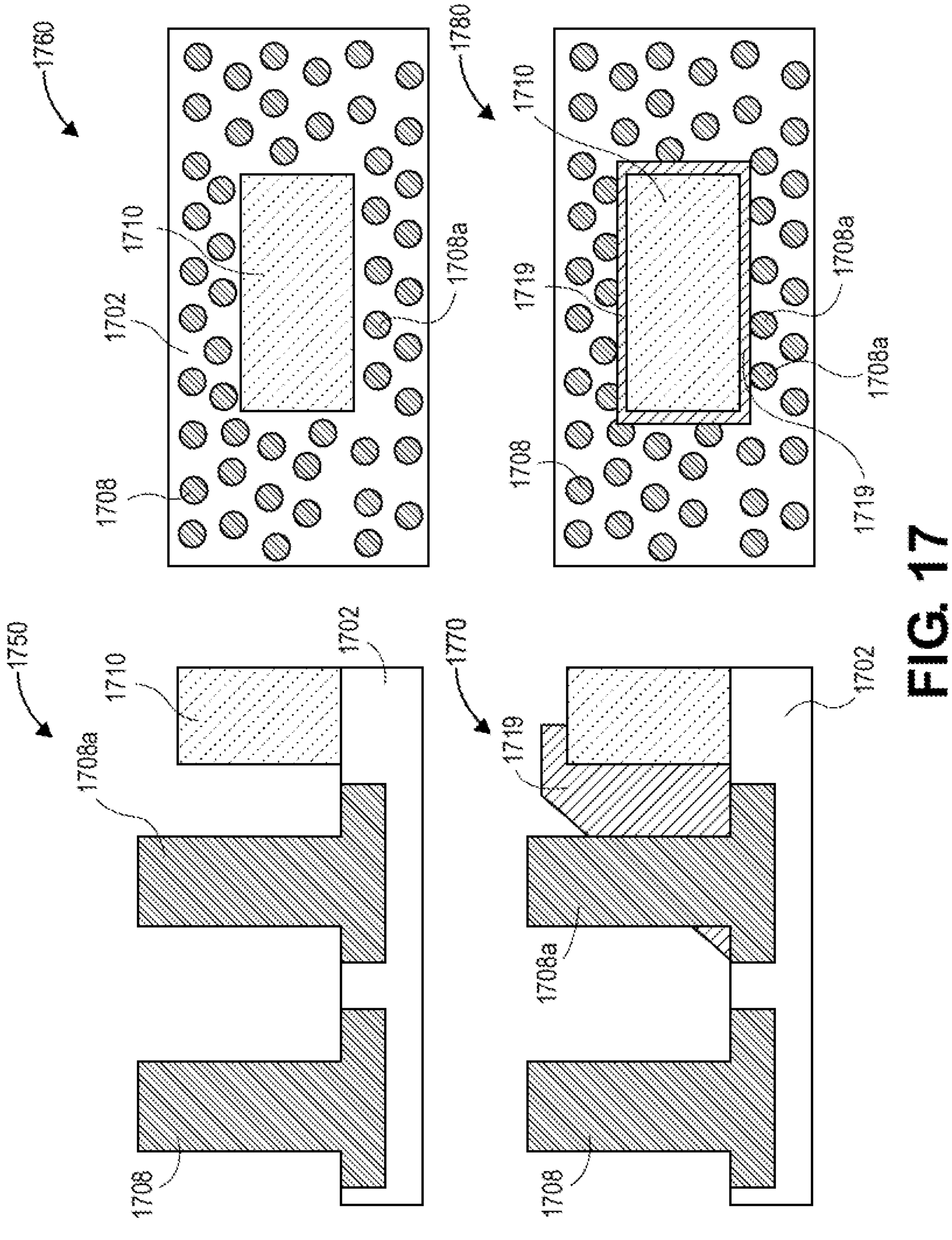
FIG. 17 illustrates an example of a dam physically coupled with a die on a substrate, where the dam includes dielectric material supported by one or more pillars, in accordance with various embodiments.

FIG. 17 illustrates an example of a dam physically coupled with a die on a substrate, where the dam includes dielectric material supported by one or more pillars, in accordance with various embodiments. Diagram 1750 shows a cross-section side view and diagram 1760 shows a top-down view of a substrate 1702, with pillars 1708, including pillars 1708*a*, formed on the surface of the substrate 1702 proximate to a die 1710. In embodiments, the pillars 1708 may be similar to pillars 208 of FIG. 2, and pillars 1708*a* may be proximate to the die 1710.

Diagram 1770 shows a cross-section side view and diagram 1780 shows a top-down view of the substrate 1702, where a dielectric material 1719 is placed around and in physical contact with the die 1710. The dielectric material 1719 is also in physical contact with a subset of the pillars 1708*a* that are in close proximity to the die 1710. In this way, the dielectric material 1719 is able to buttress the die 1710 and also be supported by the pillars 1708*a*. This approach may minimize loss of substrate 1702 area to a separately created dam structure, such as dam 230 of FIG. 2.

FIG. 18 illustrates stages in the manufacturing process for forming a die on a substrate with a cavity into which a die is placed, in accordance with various embodiments. FIG. 18A shows a stage in the manufacturing process where a substrate 1802, which may be similar to substrate 202 of FIG. 2, is formed. Copper pillars 1808, which may be similar to pillars 208 of FIG. 2, may be formed on the substrate 1802. In embodiments, a conductive layer 1803, which may be similar to conductive layer 503 of FIG. 5A, may be placed on a surface of the substrate 1802.

Figure 18A:
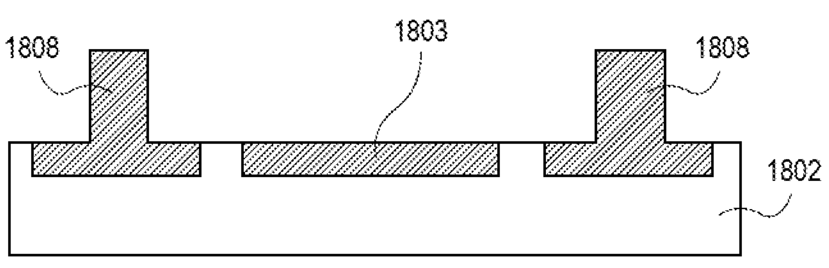
FIGS. 18A-18F illustrate stages in the manufacturing process for forming a die on a substrate with full cavity into which a die is placed, in accordance with various embodiments.
Figure 18B:
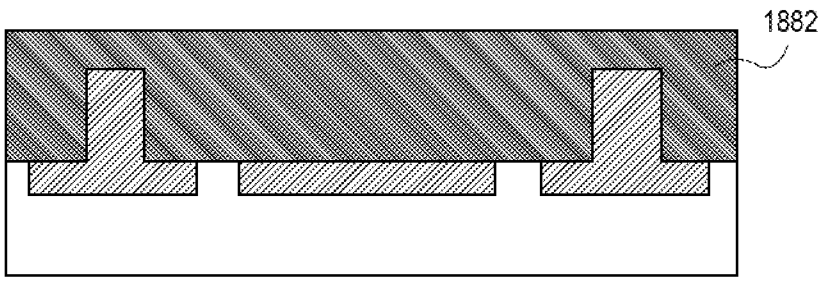

FIG. 18B shows a stage in the manufacturing process where an encapsulation layer 1882, which may be a DFR, is applied to the substrate 1802. In embodiments the encapsulation layer 1882 may encapsulate all or part of the pillars 1808.

Figure 18C:
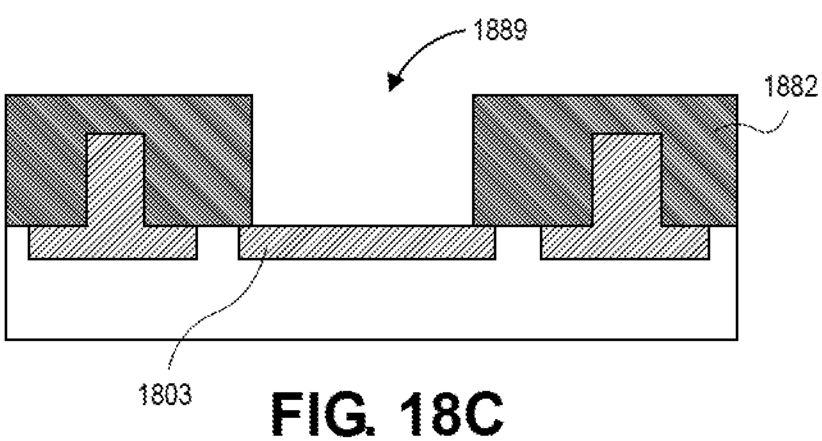

FIG. 18C shows a stage in the manufacturing process where a cavity 1889 is formed within the encapsulation layer 1882. In embodiments, the cavity 1889 will expose the conductive layer 1803.

Figure 18D:
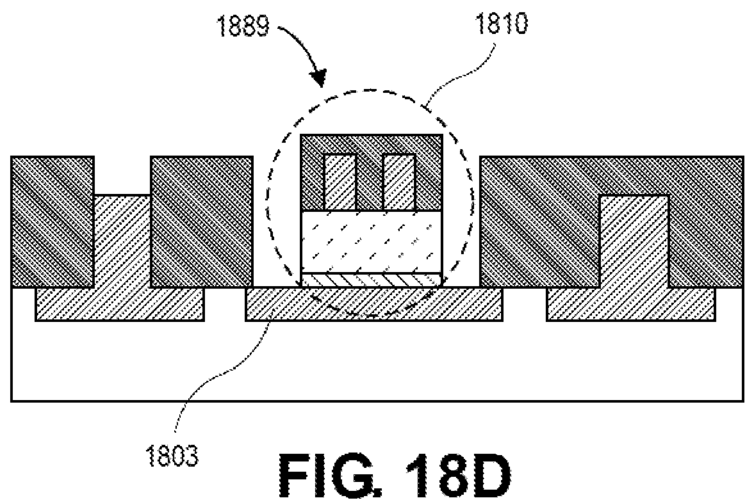

FIG. 18D shows a stage in the manufacturing process where a die complex 1810 is coupled with the conductive layer 1803 within the cavity 1889.

Figure 18E:
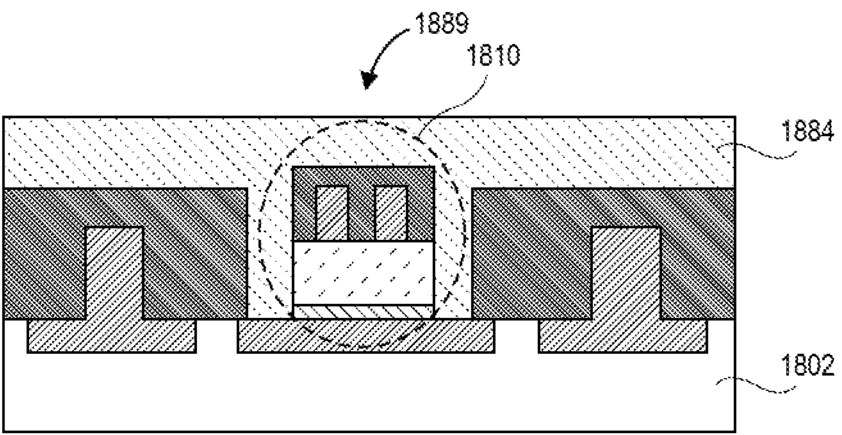

FIG. 18E shows a stage in the manufacturing process where a second encapsulation material 1884 is flowed over the encapsulation layer 1882 and surrounding the die complex 1810 within the cavity 1889. Note that the portion of the cavity 1889 surrounding the die complex 1810 may make the flow of the second encapsulation material 1884 toward the die 1810 more symmetric such that the pressure difference on the walls of the die 1810 will be minimized. As a result, the die 1810 will be less likely to shift.

Figure 18F:
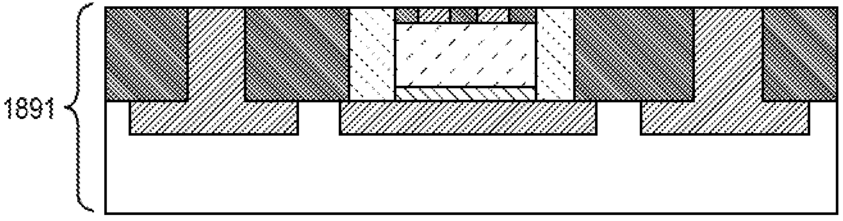

FIG. 18F shows a stage in the manufacturing process where a planarization occurs resulting in a final package 1891.

Figure 19:
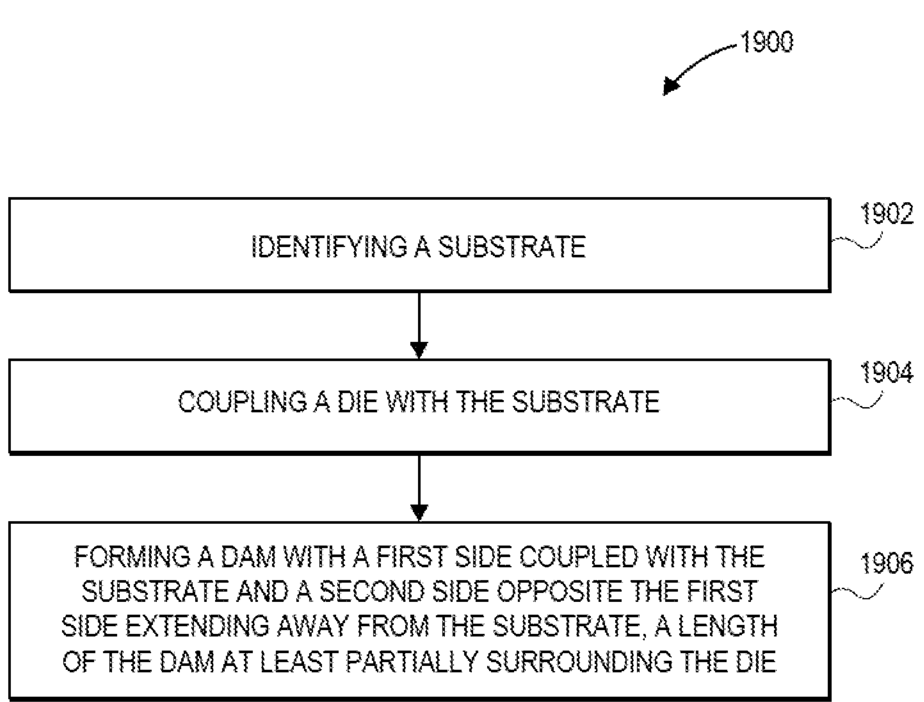
FIG. 19 illustrates an example of a process for creating a dam on a substrate that surrounds a die, in accordance with various embodiments.

FIG. 19 illustrates an example of a process for creating a dam on a substrate that surrounds a die, in accordance with various embodiments. Process 1900 may be performed by the techniques, apparatus, systems, and/or processes described herein, or in particular with respect to FIGS. 1-18E.

At block 1902, the process may include identifying a substrate. The substrate may be similar to substrate 202 of FIG. 2, substrate 302 of FIGS. 3A-3D, substrate 402 of FIGS. 4A-4C, substrate 502 of FIGS. 5A-5D, substrate 702 of FIGS. 7A-7B, substrate 802 of FIGS. 8A-8B, substrate 902 of FIGS. 9A-9B, substrate 1002 of FIGS. 10A-10B, substrate 1102 of FIGS. 11A-11B, substrate 1202 of FIGS. 12A-12D, substrate 1302 of FIGS. 13A-13B, substrate 1402 of FIG. 14, substrate 1502 of FIG. 15, substrate 1602 of FIG. 16, substrate 1702 of FIG. 17, or substrate 1802 of FIGS. 18A-18F.

At block 1904, the process may further include coupling a die with the substrate. The die may be similar to die 210 of FIG. 2, die 310 of FIGS. 3C-3D, die 410 of FIGS. 4B-4C, die 510 of FIGS. 5C-5D, dies 640, 650, 660 of FIG. 6, die 710 of FIGS. 7A-7B, die 810 of FIGS. 8A-8B, die 910 of FIGS. 9A-9B, die 1010 of FIGS. 10A-10B, die 1110 of FIGS. 11A-11B, die 1410 of FIG. 14, die 1510 of FIG. 15, die 1610 of FIG. 16, die 1710 of FIG. 17, or die 1810 of FIGS. 18D-18F.

At block 1906, the process may further include forming a dam with a first side coupled with the substrate and a second side opposite the first side extending away from the substrate, a length of the dam at least partially surrounding the die. The dam may be similar to dam 230 of FIG. 2, dam 330 of FIGS. 3B-3D, dam 660 of FIG. 6, dam 730 of FIGS. 7A-7B, dam 830 of FIGS. 8A-8B, dam 930 of FIGS. 9A-9B, dam 1030 of FIGS. 10A-10B, dam 1130 of FIGS. 11A-11B, dam 1430 of FIG. 14, dam 1530*a*, 1530*b* of FIG. 15, dam 1619 of FIG. 16, or dam 1719 of FIG. 17.

Figure 20:
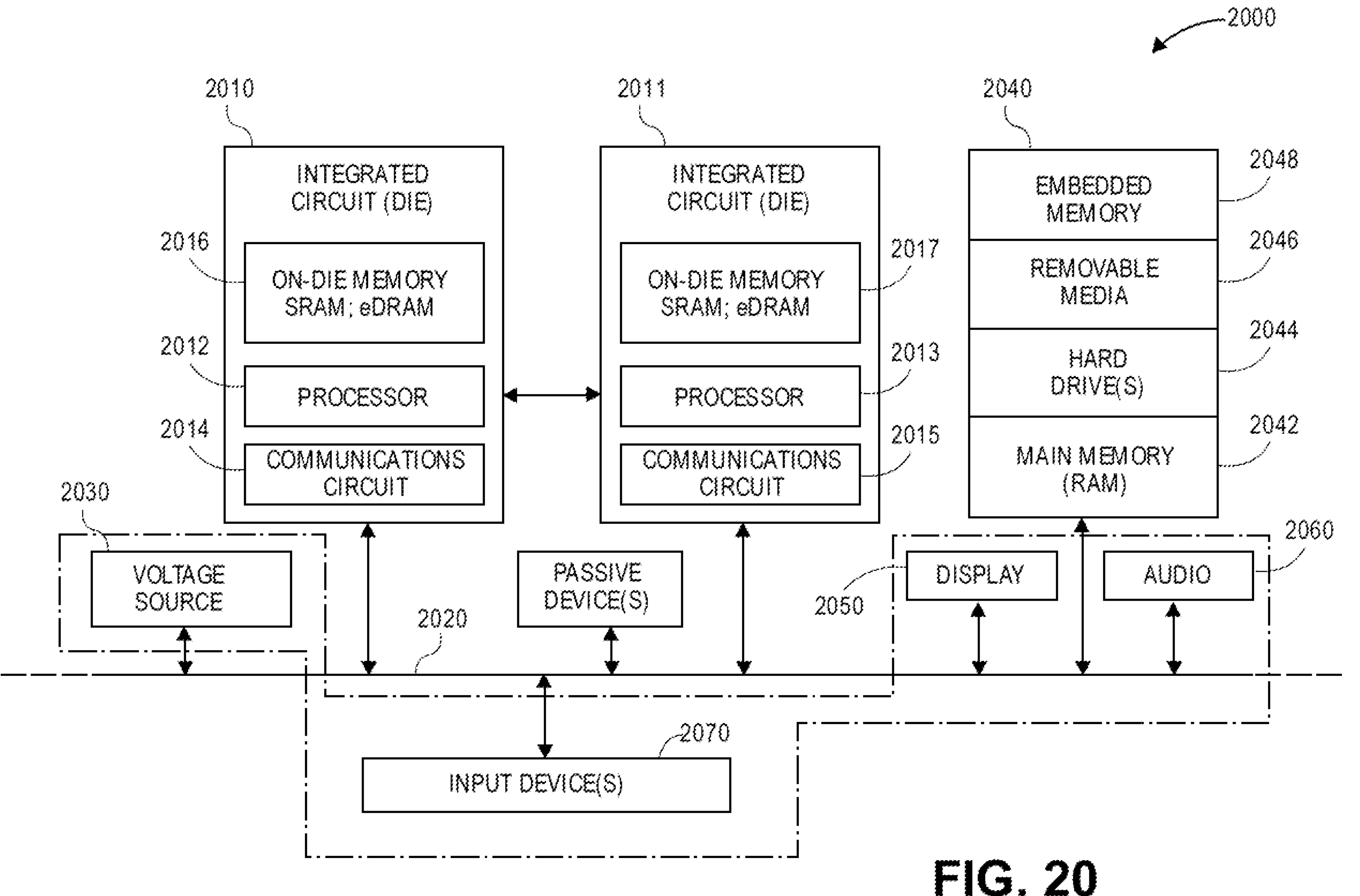
FIG. 20 schematically illustrates a computing device, in accordance with various embodiments.

FIG. 20 is a schematic of a computer system 2000, in accordance with an embodiment of the present invention. The computer system 2000 (also referred to as the electronic system 2000) as depicted can embody a dam surrounding a die on a substrate, according to any of the several disclosed embodiments and their equivalents as set forth in this disclosure. The computer system 2000 may be a mobile device such as a netbook computer. The computer system 2000 may be a mobile device such as a wireless smart phone. The computer system 2000 may be a desktop computer. The computer system 2000 may be a hand-held reader. The computer system 2000 may be a server system. The computer system 2000 may be a supercomputer or high-performance computing system.

In an embodiment, the electronic system 2000 is a computer system that includes a system bus 2020 to electrically couple the various components of the electronic system 2000. The system bus 2020 is a single bus or any combination of busses according to various embodiments. The electronic system 2000 includes a voltage source 2030 that provides power to the integrated circuit 2010. In some embodiments, the voltage source 2030 supplies current to the integrated circuit 2010 through the system bus 2020.

The integrated circuit 2010 is electrically coupled to the system bus 2020 and includes any circuit, or combination of circuits according to an embodiment. In an embodiment, the integrated circuit 2010 includes a processor 2012 that can be of any type. As used herein, the processor 2012 may mean any type of circuit such as, but not limited to, a microprocessor, a microcontroller, a graphics processor, a digital signal processor, or another processor. In an embodiment, the processor 2012 includes, or is coupled with, a dam surrounding a die on a substrate, as disclosed herein. In an embodiment, SRAM embodiments are found in memory caches of the processor. Other types of circuits that can be included in the integrated circuit 2010 are a custom circuit or an application-specific integrated circuit (ASIC), such as a communications circuit 2014 for use in wireless devices such as cellular telephones, smart phones, pagers, portable computers, two-way radios, and similar electronic systems, or a communications circuit for servers. In an embodiment, the integrated circuit 2010 includes on-die memory 2016 such as static random-access memory (SRAM). In an embodiment, the integrated circuit 2010 includes embedded on-die memory 2016 such as embedded dynamic random-access memory (eDRAM).

In an embodiment, the integrated circuit 2010 is complemented with a subsequent integrated circuit 2011. Useful embodiments include a dual processor 2013 and a dual communications circuit 2015 and dual on-die memory 2017 such as SRAM. In an embodiment, the dual integrated circuit 2010 includes embedded on-die memory 2017 such as eDRAM.

In an embodiment, the electronic system 2000 also includes an external memory 2040 that in turn may include one or more memory elements suitable to the particular application, such as a main memory 2042 in the form of RAM, one or more hard drives 2044, and/or one or more drives that handle removable media 2046, such as diskettes, compact disks (CDs), digital variable disks (DVDs), flash memory drives, and other removable media known in the art. The external memory 2040 may also be embedded memory 2048 such as the first die in a die stack, according to an embodiment.

In an embodiment, the electronic system 2000 also includes a display device 2050, an audio output 2060. In an embodiment, the electronic system 2000 includes an input device such as a controller 2070 that may be a keyboard, mouse, trackball, game controller, microphone, voice-recognition device, or any other input device that inputs information into the electronic system 2000. In an embodiment, an input device 2070 is a camera. In an embodiment, an input device 2070 is a digital sound recorder. In an embodiment, an input device 2070 is a camera and a digital sound recorder.

As shown herein, the integrated circuit 2010 can be implemented in a number of different embodiments, including a package substrate having a dam surrounding a die on a substrate, according to any of the several disclosed embodiments and their equivalents, an electronic system, a computer system, one or more methods of fabricating an integrated circuit, and one or more methods of fabricating an electronic assembly that includes a package substrate having a dam surrounding a die on a substrate, according to any of the several disclosed embodiments as set forth herein in the various embodiments and their art-recognized equivalents. The elements, materials, geometries, dimensions, and sequence of operations can all be varied to suit particular I/O coupling requirements including array contact count, array contact configuration for a microelectronic die embedded in a processor mounting substrate according to any of the several disclosed package substrates having a dam surrounding a die on a substrate embodiments and their equivalents. A foundation substrate may be included, as represented by the dashed line of FIG. 20. Passive devices may also be included, as is also depicted in FIG. 20.

Various embodiments may include any suitable combination of the above-described embodiments including alternative (or) embodiments of embodiments that are described in conjunctive form (and) above (e.g., the "and" may be "and/or"). Furthermore, some embodiments may include one or more articles of manufacture (e.g., non-transitory computer-readable media) having instructions, stored thereon, that when executed result in actions of any of the above-described embodiments. Moreover, some embodiments may include apparatuses or systems having any suitable means for carrying out the various operations of the above-described embodiments.

The above description of illustrated embodiments, including what is described in the Abstract, is not intended to be exhaustive or to limit embodiments to the precise forms disclosed. While specific embodiments are described herein for illustrative purposes, various equivalent modifications are possible within the scope of the embodiments, as those skilled in the relevant art will recognize.

These modifications may be made to the embodiments in light of the above detailed description. The terms used in the following claims should not be construed to limit the embodiments to the specific implementations disclosed in the specification and the claims. Rather, the scope of the invention is to be determined entirely by the following claims, which are to be construed in accordance with established doctrines of claim interpretation.

The following paragraphs describe examples of various embodiments.

EXAMPLES

Example 1 is a package comprising: a substrate; a die with a first side and a second side opposite the first side, wherein the first side of the die is coupled with the substrate; and a dam with a first side and a second side opposite the first side, wherein the first side of the dam is directly physically coupled with the substrate and the second side of the dam extends away from the substrate, and wherein the dam at least partially surrounds the die.

Example 2 includes the package of example 1, wherein the die and the dam are positioned within a cavity in the substrate.

Example 3 includes the package of example 1, wherein a distance between the first side of the dam and the second side of the dam is substantially a same distance throughout a length of the dam.

Example 4 includes the package of example 1, wherein the dam completely surrounds the die.

Example 5 includes the package of example 4, further including a capillary underfill (CUF) on a portion of the substrate surrounded by the dam.

Example 6 includes the package of example 5, wherein the CUF extends to one or more edges of the die between the first side of the die and the second side of the die.

Example 7 includes the package of example 5, further comprising one or more copper features between the first side of the die and the substrate; and wherein the CUF extends below the first side of the die and in between the one or more copper features.

Example 8 includes the package of example 7, wherein the CUF is a liquid flux.

Example 9 includes the package of example 1, wherein the dam is proximate to one or more edges of the die between the first side of the die in the second side of the die; and further comprising: a material proximate to a surface of the substrate, and coupled with the dam and with the die.

Example 10 includes the package of example 9, wherein the material is a selected one of a CUF or a dielectric.

Example 11 includes the package of any one of examples 1-10, wherein the dam includes copper.

Example 12 includes the package of example 1, further comprising one or more copper pillars coupled with the substrate and proximate to the die; and wherein the dam includes a dielectric material physically coupled with the one or more copper pillars.

Example 13 includes the package of example 12, wherein the dielectric material is physically coupled with the die.

Example 14 is a method comprising: identifying a substrate; coupling a die with the substrate; and forming a dam with a first side coupled with the substrate and a second side opposite the first side extending away from the substrate, a length of the dam at least partially surrounding the die.

Example 15 includes the method of example 14, wherein the dam completely surrounds the die.

Example 16 includes the method of example 14, wherein forming a dam further includes plating copper onto the surface of the substrate.

Example 17 includes the method of example 14, wherein forming a dam further includes: forming one or more copper pillars on a surface of the substrate proximate to the die; and applying dielectric material to the surface of the substrate proximate to the die, wherein the dielectric material is physically coupled with the one or more copper pillars.

Example 18 includes the method of example 14, wherein after forming the dam, the method further comprises applying a CUF on a surface of the substrate, the CUF physically coupled with a portion of the dam and with a portion of the die.

Example 19 includes the method of example 14, wherein the die has a first z-height from a surface of the substrate, and wherein the dam has a second z-height from the surface of the substrate; and wherein the second z-height is less than the first z-height.

Example 20 includes the method of any one of examples 14-19, further comprising flowing encapsulation material over the substrate to at least partially encapsulate the die, the encapsulation material interacting with the formed dam.

Example 21 includes the method of example 20, wherein flowing encapsulation material over the substrate further includes flowing encapsulation material over the second side of the dam.

Example 22 is a package comprising: a substrate; a plurality of copper features surrounding an area of the substrate, wherein the copper features have a first end and a second end opposite the first end, wherein the first end is physically coupled with a surface of the substrate and the second end extends away from the surface of the substrate; a die with a first side and a second side opposite the first side, wherein the first side of the die is coupled with the substrate within the area of the substrate; a dam with a first side and a second side opposite the first side, wherein the first side of the dam is directly physically coupled with the substrate within the area of the substrate and the second side of the dam extends away from the substrate, and wherein the dam at least partially surrounds the die; and molding that encapsulates the plurality of copper features, the die, and the dam.

Example 23 includes the package of example 22, further comprising: a CUF layer proximate to a surface of the area of the substrate, wherein the CUF layer extends from a portion of the dam to a portion of the die.

Example 24 includes the package of example 22, wherein the dam includes copper.

Example 25 includes the package of example 22, further comprising: one or more copper pillars within the area of the substrate, the copper pillars having a first end and a second end opposite the first and, wherein the first end is physically coupled with the substrate and the second and extends away from the substrate; and wherein the dam includes a dielectric that is physically coupled with the one or more copper pillars.

Example 26 is a package comprising: a substrate having a surface; a copper pad on the surface of the substrate; a first metal structure, the first metal structure having a first end on the pad and a second end that that is spaced apart from the surface of the substrate; a die with a first side and a second side opposite the first side, wherein the first side of the die is on the surface of the substrate; a second metal structure between the die and the first metal structure, the second metal structure having a first end on the surface of the substrate and a second end spaced apart from the surface of the substrate; and a mold compound on the first and second metal structures and on the die.

Example 27 includes the package of example 26, wherein the second end of the first metal structure is spaced further away from the surface of the substrate than the second end of the second metal structure.

Example 28 includes the package of example 26, further comprising: a CUF layer proximate to the surface the substrate, wherein the CUF layer extends from a portion of the second metal structure to a portion of the die.

Example 29 includes the package of any one of examples 26-28, wherein the second metal structure comprises copper.

What is claimed is:

1. A package comprising:

a substrate;

a die with a first side and a second side opposite the first side, wherein the first side of the die is coupled with the substrate;

a dam with a first side and a second side opposite the first side, wherein the first side of the dam is directly physically coupled with the substrate and the second side of the dam extends away from the substrate, and wherein the dam at least partially surrounds the die; and a plurality of pillars coupled to the substrate, wherein a top of the plurality of pillars is above a top surface of the dam, wherein the top surface of the dam is above the second side of the die, wherein the dam is laterally between the plurality of pillars and the die, and wherein there are no pillars between the dam and the die, and wherein the dam includes a dielectric material physically coupled with the plurality of pillars.

2. The package of claim 1, wherein the die is positioned within a cavity in the substrate.

3. The package of claim 1, wherein a distance between the first side of the dam and the second side of the dam is substantially a same distance throughout a length of the dam.

4. The package of claim 1, wherein the dam completely surrounds the die.

5. The package of claim 4, further including a capillary underfill (CUF) on a portion of the substrate surrounded by the dam.

6. The package of claim 5, wherein the CUF extends to one or more edges of the die between the first side of the die and the second side of the die.

7. The package of claim 5, further comprising one or more copper features between the first side of the die and the substrate; and wherein the CUF extends below the first side of the die and in between the one or more copper features.

8. The package of claim 7, wherein the CUF is a liquid flux.

9. The package of claim 1, wherein the dam is proximate to one or more edges of the die between the first side of the die in the second side of the die; and further comprising:

a material proximate to a surface of the substrate, and coupled with the dam and with the die.

10. The package of claim 9, wherein the material is a selected one of a CUF or a dielectric.

11. The package of claim 1, wherein the dam includes copper.

12. The package of claim 1, wherein the dielectric material is physically coupled with the die.

13. A method comprising:

providing a substrate;

coupling a die with the substrate;

forming a dam with a first side coupled with the substrate and a second side opposite the first side extending away from the substrate, a length of the dam at least partially surrounding the die; and forming a plurality of pillars coupled to the substrate, wherein a top of the plurality of pillars is above a top surface of the dam, wherein the top surface of the dam is above a top surface of the die, wherein the dam is laterally between the plurality of pillars and the die, wherein there are no pillars between the dam and the die, and wherein the dam includes a dielectric material physically coupled with the plurality of pillars.

14. The method of claim 13, wherein the dam completely surrounds the die.

15. The method of claim 13, wherein forming a dam further includes plating copper onto the surface of the substrate.

16. The method of claim 13, wherein after forming the dam, the method further comprises applying a CUF on a surface of the substrate, the CUF physically coupled with a portion of the dam and with a portion of the die.

17. The method of claim 13, wherein the die has a first z-height from a surface of the substrate, and wherein the dam has a second z-height from the surface of the substrate; and wherein the second z-height is less than the first z-height.

18. The method of claim 13, further comprising flowing encapsulation material over the substrate to at least partially encapsulate the die, the encapsulation material interacting with the formed dam.

19. The method of claim 18, wherein flowing encapsulation material over the substrate further includes flowing encapsulation material over the second side of the dam.

* * * * *